(12) United States Patent
Ooki et al.

(10) Patent No.: US 9,133,602 B2
(45) Date of Patent: Sep. 15, 2015

(54) INFORMATION MANAGEMENT SYSTEM FOR CONSTRUCTION MACHINE

(75) Inventors: Takatoshi Ooki, Kasumigaura (JP); Kouji Ishikawa, Kasumigaura (JP); Hidetoshi Satake, Ishioka (JP); Shinji Nishikawa, Kasumigaura (JP)

(73) Assignee: HITACHI CONSTRUCTION MACHINERY CO., LTD., Tokyo (JP)

( * ) Notice: Subject to any disclaimer, the term of this patent is extended or adjusted under 35 U.S.C. 154(b) by 626 days.

(21) Appl. No.: 13/473,716

(22) Filed: May 17, 2012

(65) Prior Publication Data

US 2012/0296574 A1 Nov. 22, 2012

(30) Foreign Application Priority Data

May 19, 2011 (JP) ................................. 2011-112838

(51) Int. Cl.
| | | |
|---|---|---|
| G06F 11/00 | (2006.01) |
| E02F 9/12 | (2006.01) |
| E02F 9/20 | (2006.01) |
| E02F 9/26 | (2006.01) |
| G01R 31/06 | (2006.01) |
| G01R 31/28 | (2006.01) |

(52) U.S. Cl.
CPC ............... *E02F 9/123* (2013.01); *E02F 9/2095* (2013.01); *E02F 9/267* (2013.01); *G01R 31/06* (2013.01); *G01R 31/2829* (2013.01)

(58) Field of Classification Search
CPC ......... E02F 9/123; E02F 9/2095; E02F 9/267; G01R 31/06; G01R 31/2829
USPC ............... 700/6, 10, 19, 21, 26, 247; 73/1.23, 73/1.72, 39; 702/35
See application file for complete search history.

(56) References Cited

U.S. PATENT DOCUMENTS

| | | | | |
|---|---|---|---|---|
| 4,672,863 A | * | 6/1987 | Itoh et al. ........................ | 477/41 |
| 5,077,973 A | * | 1/1992 | Suzuki et al. ................... | 60/428 |
| 5,555,171 A | * | 9/1996 | Sonehara et al. ............ | 701/34.3 |
| 6,055,851 A | * | 5/2000 | Tanaka et al. .................... | 73/46 |
| 6,134,488 A | * | 10/2000 | Sasaki et al. ................. | 701/32.8 |
| 8,818,648 B2 | * | 8/2014 | Takanashi et al. .............. | 701/50 |
| 2009/0055056 A1 | * | 2/2009 | Ooki et al. ....................... | 701/50 |
| 2010/0070130 A1 | * | 3/2010 | Suzuki et al. ................... | 701/35 |
| 2012/0035802 A1 | * | 2/2012 | Suzuki et al. ................ | 701/29.1 |

FOREIGN PATENT DOCUMENTS

| | | | | |
|---|---|---|---|---|
| JP | 2004-232343 A | | 8/2004 | |
| JP | 2007-292316 | * | 11/2007 | ............ F15B 20/00 |
| JP | 2007-292316 A | | 11/2007 | |
| JP | 2007292316 | * | 11/2007 | |
| JP | 4405159 B2 | | 11/2009 | |

* cited by examiner

*Primary Examiner* — John Breene
*Assistant Examiner* — Mohammad K Islam
(74) *Attorney, Agent, or Firm* — Mattingly & Malur, PC

(57) ABSTRACT

The present invention provides an information management system suitable for a construction machine, which drives a solenoid valve separately from normal control to thereby make it possible to perform failure diagnosis for the solenoid valve and each sensor easily and with satisfactory accuracy. A controller has a failure diagnosis mode selected by a control panel of a display device. When the failure diagnosis mode is selected by the control panel and instructions for failure diagnosis related to a specific solenoid valve of a plurality of solenoid valves are given, the controller outputs a failure diagnosis drive signal to the specific solenoid valve, inputs an output value from a sensor related to the specific solenoid valve among a plurality of sensors, and displays, based on the output value from the specific sensor, information as to whether the specific solenoid valve and the specific sensor are normal on a display device.

6 Claims, 17 Drawing Sheets

FIG. 11

| SWING-SYSTEM SOLENOID VALVES FORCED DRIVE | | | TO [Home] TOP |
|---|---|---|---|
| SWING RIGHT PRESSURE REDUCING SOLENOID VALVE | ON(INEFFECTIVE IN RIGHT SWING) | OFF(EFFECTIVE IN RIGHT SWING) | TO [Back] ONE UP |
| SWING LEFT PRESSURE REDUCING SOLENOID VALVE | ON(INEFFECTIVE IN LEFT SWING) | OFF(EFFECTIVE IN LEFT SWING) | |
| SWING RIGHT LOW-PRESSURE RELIEF SOLENOID VALVE | ON(RIGHT LOW-PRESSURE SETTING) | OFF(RIGHT NORMAL SETTING) | |
| SWING LEFT LOW-PRESSURE RELIEF SOLENOID VALVE | ON(LEFT LOW-PRESSURE SETTING) | OFF(LEFT NORMAL SETTING) | |
| SWING RIGTH PILOT PRESSURE | | MPa | |
| SWING LEFT PILOT PRESSURE | | MPa | |
| SWING RIGHT MAIN PRESSURE | | MPa | |
| SWING LEFT MAIN PRESSURE | | MPa | |
| SWING RIGHT MAIN PRESSURE MAXIMUM VALUE | | MPa | |
| SWING LEFT MAIN PRESSURE MAXIMUM VALUE | | MPa | |

INFORMATION MANAGEMENT SYSTEM FOR CONSTRUCTION MACHINE

BACKGROUND OF THE INVENTION

1. Field of the Invention

The present invention relates to an information management system for a construction machine such as a hydraulic excavator, and particularly to an information management system for a construction machine equipped with an electric hydraulic system including a plurality of sensors, a hydraulic system including a plurality of solenoid valves, and a controller.

2. Description of the Related Art

In a construction machine such as a hydraulic excavator, a high resolution monitor is mounted within a cab and capable of displaying various information thereon. The construction machine is equipped with a controller to which various status signals of its body are inputted. The controller is capable of grasping various states of the body.

There has been known an information management system described in Japanese Patent No. 4405159 as one that performs diagnosis on a device failure and the like using such a monitor and a controller as described above.

In the information management system described in Japanese Patent No. 4405159, instructions for measurement are displayed on the monitor, and an operator compares the result of measurement obtained by manipulating a control lever in accordance with the instructions with at-shipment data stored in the controller in advance to thereby perform failure diagnosis on devices (sensor, solenoid valve, etc.) built in a construction machine.

SUMMARY OF THE INVENTION

The related art described in Japanese Patent No. 4405159 is however accompanied by the following problems.

In Japanese Patent No. 4405159, the result of measurement obtained by manipulating the control lever by the operator is compared with the at-shipment data stored in the controller in advance to thereby diagnose the presence or absence of a failure. However, the operation of a device such as a solenoid valve by the manipulation of the control lever by the operator is an operation done under normal control and includes results calculated from various input values such as pressure, temperature, the number of revolutions, etc. It is therefore not easy to specify whether an abnormality exists in the device, from the result of measurement where the device is controlled in that way.

An object of the present invention is to provide an information management system for a construction machine, which drives a solenoid valve separately from normal control to thereby make it possible to perform failure diagnosis on the solenoid valve and a sensor easily and with satisfactory accuracy.

(1) In order to solve the above problems, the present invention provides an information management system for a construction machine, comprising: a hydraulic system which drives the construction machine, and a control system which controls the hydraulic system, the control system including a plurality of sensors which respectively output various status signals of the construction machine, a plurality of solenoid valves which respectively output various operation control pressures for controlling the hydraulic system, and a controller which inputs the status signals therein and outputs drive signals for driving the solenoid valves, wherein said information management system comprises a monitor device which transfers information to and from the controller and displays various items of information thereon, the monitor device having an input device that receives inputs from outside, wherein the controller has a failure diagnosis mode selected by the input device of the monitor device, and wherein when the failure diagnosis mode is selected by the input device and instructions for failure diagnosis related to the specific solenoid valve are given, the controller outputs a failure diagnosis drive signal to a specific solenoid valve of the solenoid valves and then inputs an output value from a specific sensor related to the specific solenoid valve among the plurality of sensors and displays, based on the output value from the specific sensor, information as to whether the specific solenoid valve and the specific sensor are normal on the monitor device.

By outputting the failure diagnosis drive signal to the specific solenoid valve when the failure diagnosis mode is selected and the instructions for the failure diagnosis related to the specific solenoid valve are given, the solenoid valve can be driven separately from normal control, thus making it possible to output the drive signal easy to perform failure determination to the corresponding solenoid valve. Thus, the output value given from the specific sensor is thereafter inputted and the information as to whether the specific solenoid valve and the specific sensor are normal, based on the output value from the specific sensor is displayed on the monitor device, whereby failure diagnosis on the solenoid valve and the sensor can be carried out easily and with satisfactory accuracy.

(2) In the above (1), preferably, the controller displays instructions for an operation related to the specific solenoid valve on the monitor device in the failure diagnosis mode, and the controller inputs output values from the sensors therein when operated in accordance with the instructions displayed on the monitor device.

It is thus possible to perform failure diagnosis easily and with satisfactory accuracy despite of the proficiency level of an operator.

(3) In the above (1) or (2), preferably, the controller has a storage unit which stores a normal value of the specific sensor therein, and in the failure diagnosis mode, the controller compares the output value given from the specific sensor at the time that the controller outputs the failure diagnosis drive signal, with the normal value stored in the storage unit to thereby determine whether the specific solenoid valve and the specific sensor are normal, and displays a result of determination on the monitor device.

Thus, the controller shares part of the failure diagnosis, thereby making it possible to carry out failure diagnosis easily and with satisfactory accuracy.

(4) In the above (1) through (3), preferably, the construction machine is a hydraulic excavator having a track structure and a swing structure provided over the track structure. The hydraulic system has a swing hydraulic motor which pivotally drives the swing structure, a directional control valve which controls the direction of hydraulic fluid supplied to the swing hydraulic motor and a flow rate thereof, and a swing lever device which generates swing pilot pressure for giving instructions for a swing operation of the swing structure and outputs the same to a corresponding pilot pressure input unit of the directional control valve. The specific solenoid valve is a swing pilot pressure reducing solenoid valve which is disposed between the swing lever device and the pilot pressure input unit of the directional control valve and reduces the swing pilot pressure outputted from the swing lever device. The specific sensor is a first pressure sensor which detects the swing pilot pressure outputted from the swing lever device and outputs the same as an electric signal. When the failure diagnosis mode is selected by the input device and instructions for failure diagnosis related to the swing pilot pressure reducing solenoid valve are given, the controller outputs a maximum drive signal to the swing pilot pressure reducing solenoid valve as the failure diagnosis drive signal, inputs an output value from the first pressure sensor and displays on the monitor device, information as to whether the swing pilot pressure reducing solenoid valve and the first pressure sensor are normal, based on the output value given from the first pressure sensor.

Thus, the hydraulic system is provided with the swing hydraulic motor. In the hydraulic excavator equipped with the swing pilot pressure reducing solenoid valve and the first pressure sensor which detects swing pilot pressure, the swing pilot pressure reducing solenoid valve can be driven separately from normal control, and a drive signal easy to make failure determination can be supplied to the swing pilot pressure reducing solenoid valve, thus making it possible to perform failure diagnosis on the swing pilot pressure reducing solenoid valve and the first pressure sensor easily and with satisfactory accuracy.

(5) In the above (1) through (3), preferably, the construction machine is a hydraulic excavator having a track structure and a swing structure provided over the track structure. The hydraulic system has a swing hydraulic motor which pivotally drives the swing structure. The specific solenoid valve is a relief set pressure change solenoid valve which changes a maximum drive pressure of the swing hydraulic motor. The specific sensor is a second pressure sensor which detects pressure at an input/output port of the swing hydraulic motor and outputs the same as an electric signal. The controller outputs a maximum drive signal to the relief set pressure change solenoid valve as the failure diagnosis drive signal when the failure diagnosis mode is selected by the input device and instructions for failure diagnosis related to the relief set pressure change solenoid valve are given. Further, the controller inputs an output value from the second pressure sensor therein and displays on the monitor device, information as to whether the relief set pressure change solenoid valve and the second pressure sensor are normal, based on the output value given from the second pressure sensor.

Thus, the hydraulic system is provided with the swing hydraulic motor. In the hydraulic excavator equipped with the relief set pressure change solenoid valve and the second pressure sensor which detects pressure at the input/output port of the swing hydraulic motor, the relief set pressure change solenoid valve can be driven separately from normal control, and a drive signal easy to make failure determination can be supplied to the relief set pressure change solenoid valve, thus making it possible to perform failure diagnosis on the relief set pressure change solenoid valve and the second pressure sensor easily and with satisfactory accuracy.

(6) In the above (1) through (3), preferably, the construction machine is a hydraulic excavator having a track structure and a swing structure provided over the track structure. The hydraulic system has a swing hydraulic motor which pivotally drives the swing structure. The construction machine further includes an electric system having a swing electric motor which pivotally drives the swing structure in cooperation with the swing hydraulic motor. The controller is capable of switching between a hydraulic electric combined swing mode in which both the swing hydraulic motor and the swing electric motor pivotally drives the swing structure in cooperation with each other, and a hydraulic single swing mode in which the swing electric motor is stopped and the swing structure is driven only by the swing hydraulic motor. The specific solenoid valve is disposed between the swing lever device and the pilot pressure input unit of the directional control valve and is either of a swing pilot pressure reducing solenoid valve which reduces swing pilot pressure outputted from the swing lever device and a relief set pressure change solenoid valve which changes a maximum drive pressure of the swing hydraulic motor. The specific sensor is either of a first pressure sensor which detects the swing pilot pressure outputted from the swing lever device and outputs the same as an electric signal, and a second pressure sensor which detects pressure of a corresponding input/output port of the swing hydraulic motor and outputs the same as an electric signal. The controller outputs a control drive signal to the relief set pressure change solenoid valve when the hydraulic electric combined swing mode is selected, and the controller outputs a control drive signal to the swing pilot pressure reducing solenoid valve when the hydraulic single swing mode is selected. The controller executes a first failure diagnosis process in which when the failure diagnosis mode is selected by the input device and instructions for failure diagnosis related to the swing pilot pressure reducing solenoid valve are given, the controller outputs a maximum drive signal to the swing pilot pressure reducing solenoid valve as the failure diagnosis drive signal, inputs an output value from the first pressure sensor and displays on the monitor device, information as to whether the swing pilot pressure reducing solenoid valve and the first pressure sensor are normal, based on the output value given from the first pressure sensor, and a second failure diagnosis process in which when instructions for failure diagnosis related to the relief set pressure change solenoid valve are given, the controller outputs a maximum drive signal to the relief set pressure change solenoid valve as the failure diagnosis drive signal, inputs an output value from the second pressure sensor and displays on the monitor device, information as to whether the relief set pressure change solenoid valve and the second pressure sensor are normal, based on the output value given from the second pressure sensor.

Thus, in a hybrid type hydraulic excavator which is capable of switching between the hydraulic electric combined swing mode in which both the swing hydraulic motor and the swing electric motor pivotally drives the swing structure in cooperation with each other, and the hydraulic single swing mode in which the swing electric motor is stopped and the swing structure is driven only by the swing hydraulic motor, and which includes the swing pilot pressure reducing valve and the first pressure sensor which detects swing pilot pressure, and the relief set pressure change solenoid valve and the second pressure sensor which detects pressure at the input/output port of the swing hydraulic motor, the swing pilot pressure reducing solenoid valve and the relief set pressure change solenoid valve can be driven separately from the normal control. The drive signal easy to make failure determination can be supplied to the swing pilot pressure reducing solenoid valve and the relief set pressure change solenoid valve, whereby the failure diagnosis on the swing pilot pressure reducing solenoid valve and the first pressure sensor, and the relief set pressure change solenoid valve and the second pressure sensor can easily be performed with satisfactory accuracy.

According to the present invention, in the failure diagnosis mode, the failure diagnosis on the solenoid valve and the sensor can easily be carried out with satisfactory accuracy by driving the solenoid valve separately from the normal control. Since the failures of the solenoid valve and the sensor can be determined together, failure diagnosis good in efficiency is enabled.

BRIEF DESCRIPTION OF THE DRAWINGS

These and other features, objects and advantages of the present invention will become more apparent from the following description when taken in conjunction with the accompanying drawings wherein:

FIG. 11 is a diagram depicting a diagnosis screen displayed on the screen of a terminal device (personal computer) connected to a terminal device connection unit of the controller;

DESCRIPTION OF THE PREFERRED INVENTION

A preferred embodiment of the present invention will hereinafter be described using the accompanying drawings.

The embodiment of the present invention will hereinafter be explained by taking for example a hybrid type hydraulic excavator used as a construction machine.

<Configuration of Hydraulic Excavator>

Figure 1:
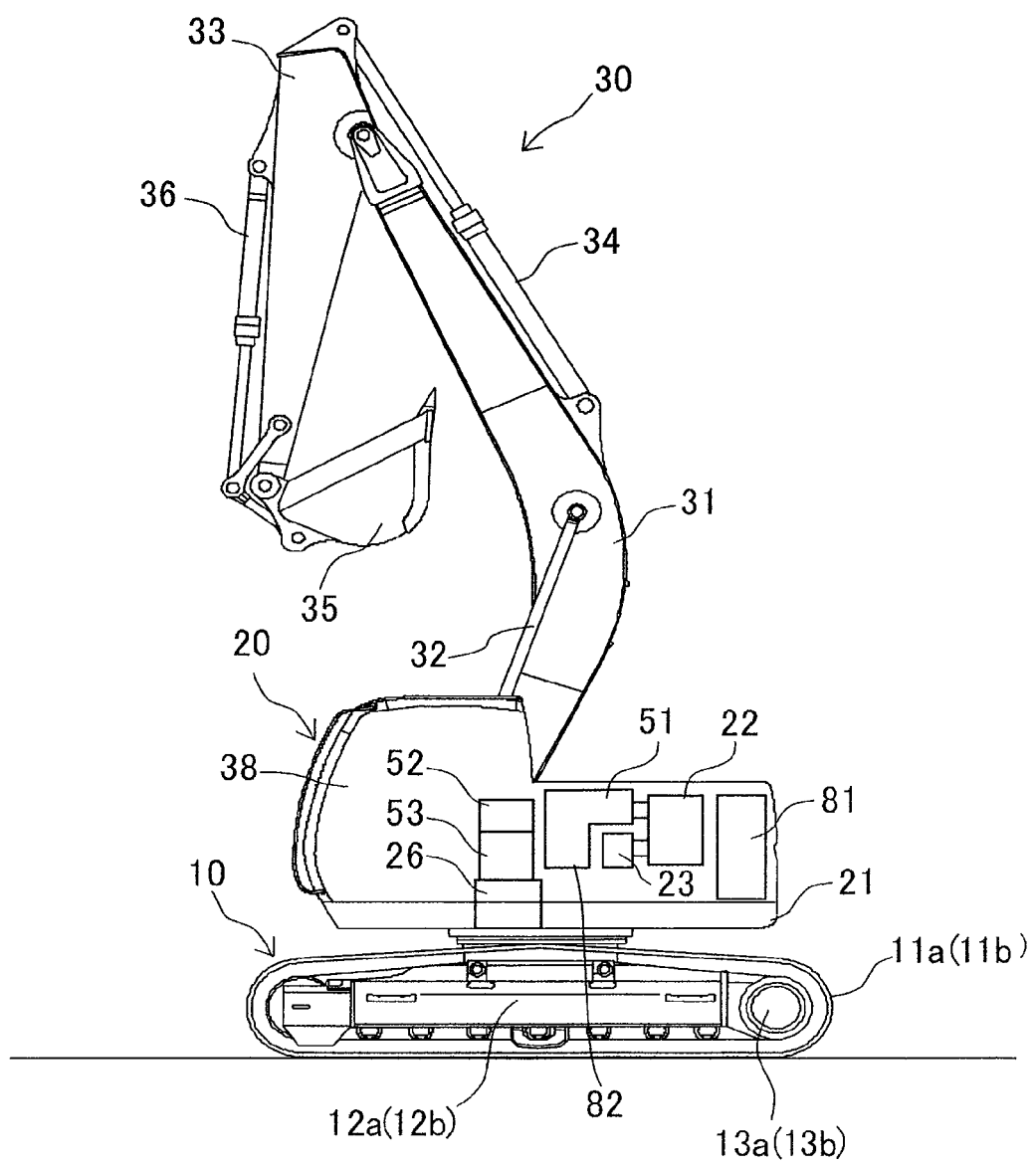
FIG. 1 is a side view of a hybrid type hydraulic excavator that is one example of a construction machine having an information management system of the present invention.

FIG. 1 is a side view of a hybrid type hydraulic excavator that is one example of a construction machine equipped with an information management system of the present invention.

In FIG. 1, the hybrid type hydraulic excavator is equipped with a lower track structure 10, an upper track structure 20 swingably provided on the lower track structure 10, and a shovel mechanism 30.

The lower track structure 10 is composed of a pair of crawlers 11a and 11b and a pair of crawler frames 12a and 12b (only one side is shown in FIG. 1), a pair of right and left traveling hydraulic motors 13a and 13b which controls the drive of each of the crawlers 11a and 11b independently, and a reduction mechanism thereof, etc.

The upper swing structure 20 is provided with a swing frame 21. There are disposed on the swing frame 21, various devices such as an engine 22 used as a prime mover, a hydraulic pump 51 driven by the engine 22, an electric generator 23 driven by the engine 22, a battery 81 for storing power generated by the electric generator 23, a swing hydraulic motor 52 driven by delivery fluid of the hydraulic pump 51, a swing electric motor 53 driven by power from the battery 81, a swing mechanism 26 which pivotally drives the upper swing structure 20 (swing frame 21) with respect to the lower track structure 10 by driving forces of the swing hydraulic motor 52 and the swing electric motor 53, an inverter 82 which controls the transfer of power between the swing electric motor 53 and the battery 81, etc. The upper swing structure 20 is principally driven by the swing hydraulic motor 52, and the swing electric motor 53 is driven in cooperation with the swing hydraulic motor 52, whereby the upper swing structure 20 is auxiliarly driven by the swing electric motor 53.

The shovel mechanism 30 is composed of a boom 31, a boom cylinder 32 for driving the boom 31, an arm 33 rotatably supported in the neighborhood of the tip portion of the boom 31, an arm cylinder 34 for driving the arm 33, a bucket 35 rotatably supported on the tip of the arm 33, a bucket cylinder 36 for driving the bucket 35, etc.

<System Configuration>

Figure 2:
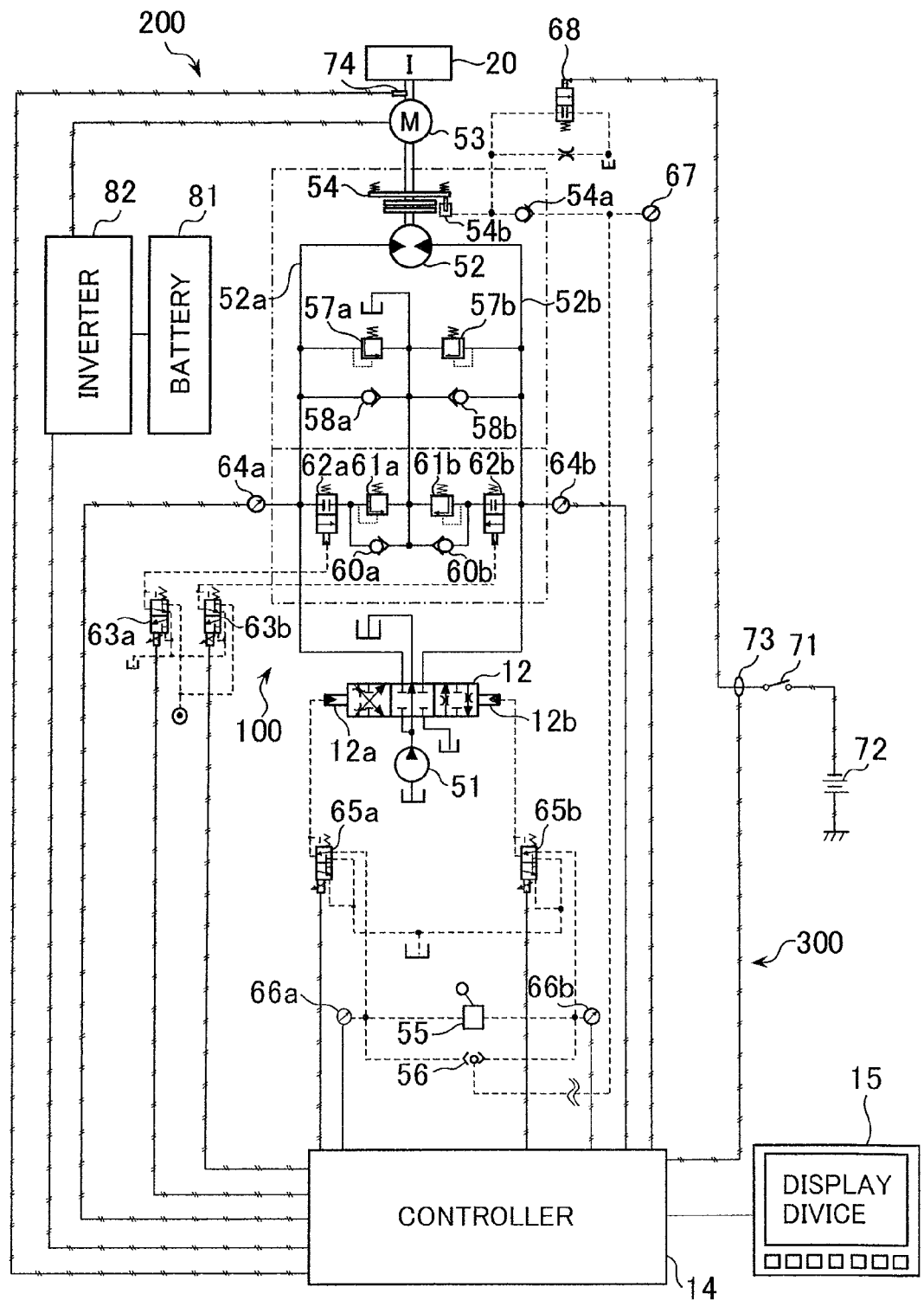
FIG. 2 is a diagram showing an electric hydraulic system of the hybrid type hydraulic excavator equipped with the information management system according to one embodiment of the present invention.

FIG. 2 is a diagram showing an electric hydraulic system of the hybrid type hydraulic excavator equipped with the information management system according to one embodiment of the present invention.

The electric hydraulic system is equipped with a hydraulic system 100 and an electric system 200 which drive the hybrid type hydraulic excavator, and a control system 300 which controls the hydraulic system 100 and the electric system 200.

The hydraulic system 100 shows only a portion related to a swing section in the hydraulic system included in the hybrid type hydraulic excavator.

The hydraulic system 100 is equipped with the above-described hydraulic pump 51 and swing hydraulic motor 52 for pivotally driving the swing structure 20.

The hydraulic system 100 is equipped with a swing directional control valve 12 which controls the flow (direction and flow rate) of hydraulic fluid supplied from the hydraulic pump 51 to the swing hydraulic motor 52 and controls the revolving direction and speed of the swing hydraulic motor 52, and high pressure relief valves 57a and 57b which are respectively connected to a left actuator line 52a and a right actuator line 52b respectively connected with a left actuator port and a right actuator port of the swing directional control valve 12 and a left port and a right port of the swing hydraulic motor 52 and which defines or prescribes the first highest pressure of the respective right and left ports of the swing hydraulic motor 52. The hydraulic system 100 is further equipped with make-up valves 58a and 58b respectively connected to the left actuator line 52a and the right actuator line 52b and for introducing hydraulic operating fluid from a tank when the left and right ports of the swing hydraulic motor 52 reach negative pressure, and low pressure relief valves 61a and 61b which are respectively connected to the left actuator line 52a and the right actuator line 52b and set to low pressure by the high pressure relief valves 57a and 57b, and which prescribes the second highest pressure of the left and right ports of the swing hydraulic motor 52. The hydraulic system 100 is further equipped with relief pressure changeover valves 62a and 62b which are respectively connected between the left and right actuator lines 52a and 52b and the low pressure relief valves 61a and 61b and switch the highest pressure of the left and right ports of the swing hydraulic motor 52 to the second highest pressure prescribed by the low pressure relief valves 61a and 61b, and make-up valves 60a and 60b respectively connected between the left and right actuator lines 52a and 52b and the low pressure relief valves 61a and 61b and for introducing hydraulic operating fluid from the tank where the left and right ports of the swing hydraulic motor 52 become negative pressure when the relief pressure changeover valves 62a and 62b are changed over. The hydraulic system 100 is further equipped with a swing parking brake 54 for controlling a swing operation of the swing structure 20 to stop and hold the swing structure 20, and a control lever device (swing lever device) 55 which generates right and left pilot pressures (swing pilot pressure) for giving instructions as to the swing operation of the swing structure 20 and incorporates therein right and left pilot valves (pressure reducing valves) that output the same to right and left pilot pressure input units 12a and 12b of the swing directional control valve 12. The hydraulic system 100 is further equipped with a shuttle valve 56 which selects high pressure of the right and left control pilot pressures outputted from the control lever device 55 and outputs the same therefrom, and a brake release cylinder 54b which is provided in the swing parking brake 54 and into which the control pilot pressure of the control lever device 55 outputted from the shuttle valve 56 is introduced via a check valve 54a and which is driven by the introduced control pilot pressure to release the braking of the swing parking brake 54.

The electric system 200 is equipped with the swing electric motor 53, the battery 81 and the inverter 82 described above. The swing electric motor 53 is operated in cooperation with the swing hydraulic motor 52 to pivotally drive the swing structure 20.

The control system 300 is equipped with a plurality of sensors 64a, 64b, 66a, 66b and 67 which output various status signals for the construction machine, a plurality of solenoid valves 63a, 63b, 65a, 65b and 68 which output various operation control pressures for controlling the hydraulic system, and a controller 14 which inputs therein the status signals of the sensors 64a, 64b, 66a, 66b and 67 and outputs drive signals for driving the solenoid valves 63a, 63b, 65a, 65b and 68.

The solenoid valves 63a and 63b are swing right-and-left low-pressure relief solenoid valves (relief set pressure change solenoid valves) which generate changeover pressures of the relief pressure changeover valves 62a and 62b in response to command signals issued from the controller 14 and change the maximum drive voltage of the swing hydraulic motor 52. The solenoid valves 65a and 65b are swing right-and-left pilot pressure reducing solenoid valves which are disposed between the swing lever device 55 and the right and left pilot pressure input units 12a and 12b of the swing directional control valve 12 and which reduce the right and left control pilot pressures of the control lever device 55 in response to command signals issued from the controller 14 and output the same to the swing directional control valve 12. The solenoid valve 68 is an emergency stop valve which causes the brake release cylinder 54b of the swing parking brake 54 to communicate with the tank and brings the swing parking brake 54 to ON.

The sensors 64a and 64b are respectively swing right-and-left pressure sensors which detect pressures (pressures of the left actuator line 52a and the right actuator line 52b) at left and right input/output ports of the swing hydraulic motor 52 and outputs the same to the controller 14 as electric signals. The sensors 66a and 66b are respectively swing right-and-left pilot pressure sensors which detect the right and left control pilot pressures outputted from the control lever device 55 to the solenoid valves 65a and 65b and output the same to the controller 14 as electric signals. The sensor 67 is a swing brake pressure sensor which detects brake line pressure for bringing the swing parking brake 54 to ON/OFF and outputs the same to the controller 14 as an electric signal.

The control system 300 is further equipped with a switch 71 for actuating the emergency stop valve 68, and a swing parking brake battery 72. The controller 14 is capable of switching between a hydraulic electric combined swing mode in which both the swing hydraulic motor 52 and the swing electric motor 53 pivotally drive the swing structure 20 in cooperation with each other, and a hydraulic single swing mode in which the swing electric motor 53 is stopped and the swing structure 20 is driven only by the swing hydraulic motor 52 (this will be described later).

The information management system according to the one embodiment of the present invention is provided in a construction machine (hybrid type hydraulic excavator) equipped with such as hydraulic system 100, electric system 200 and control system 300 described above. The information management system is equipped with the controller 14, a display device for monitoring (monitor device) 15, a current sensor 73 which detects a current that flows through a power supply line for driving the emergency stop valve 68, and a revolution sensor 74 which detects the number of revolutions of the swing structure 20.

The controller 14 is capable of switching between a normal control mode and a failure diagnosis mode according to the operation of the display device 15. When the normal control mode is selected, the controller 14 functions as one constituent element of the control system 300. When the failure diagnosis mode is selected, the controller 14 functions as one constitute element of the information management system.

Referring back to FIG. 1, a cabin 38 that constitutes an operating room is installed in the front of the upper swing structure 20. Right and left control lever devices including the swing control lever device 55 are disposed on the right and left front sides of a cab seat in the cabin 38. The controller 14 is disposed on the lower side of the cab seat. The display device for monitoring 15 and an emergency swing stop lever for manipulating the switch 71 are disposed within the cabin 38. For example, a known gate lock lever (not shown) provided on the entry side of the cab seat can be shared for the emergency swing stop lever.

<Configurations of Controller and Display Device>

Figure 3:
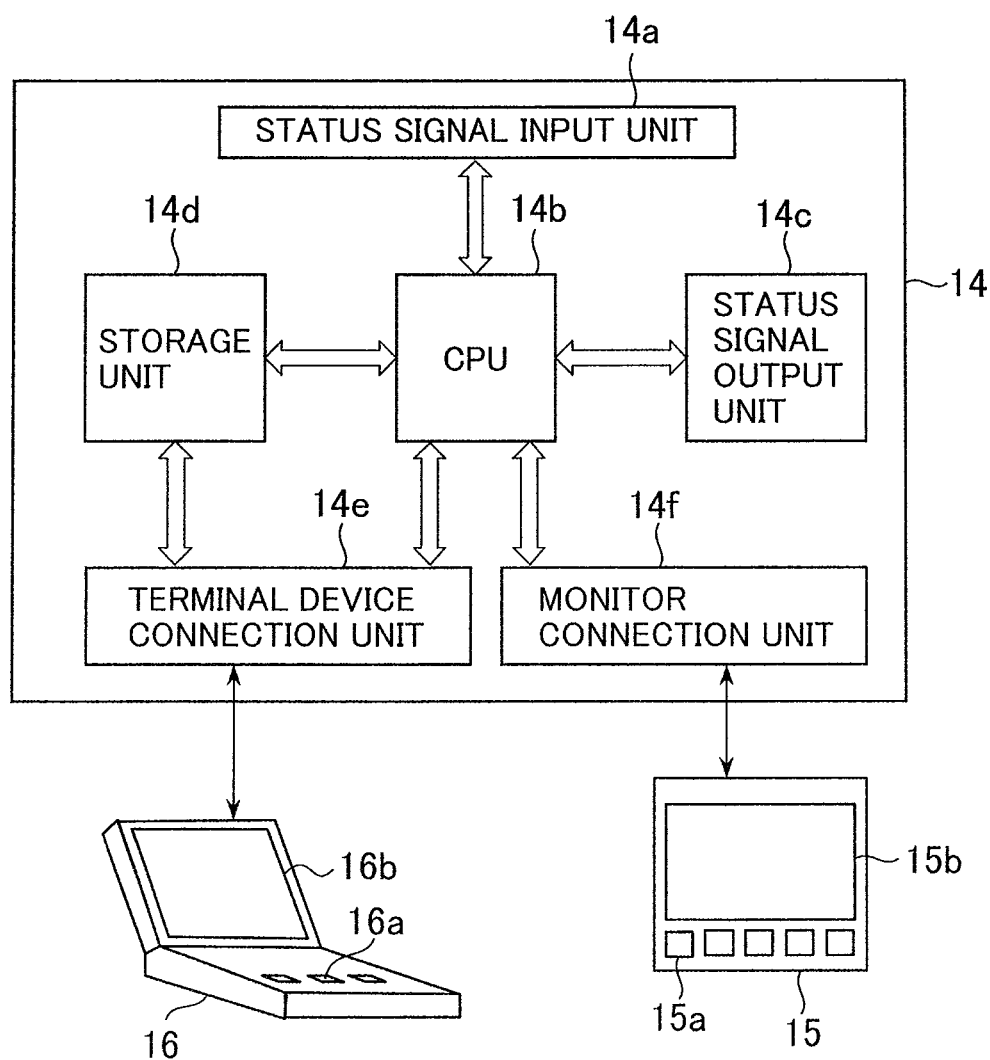
FIG. 3 is a diagram depicting an internal configuration of a controller and configurations of its peripheral devices.

FIG. 3 is a diagram showing an internal configuration of the controller 14 and configurations of its peripheral devices.

The controller 14 is equipped with a status signal input/output unit 14a which inputs therein status signals output from the above-described various sensors 64a, 64b, 66a, 66b and 67, a central processing unit (CPU) 14b which performs predetermined arithmetic processing, a command signal output unit 14c which outputs the result of arithmetic operation by the central processing unit 14b to each of the above-described solenoid valves 63a, 63b, 65a, 65b and 68 as a command signal, a storage unit 14d, a terminal device connection unit 14e and a monitor connection unit 14. A program for a processing function in the normal control mode and a program for a processing function in the failure diagnosis mode, and a normal value (decision value) of a sensor used in the processing function in the failure diagnosis mode are stored in the storage unit 14d. The central processing unit 14b performs predetermined arithmetic processing, based on those programs.

A terminal device (monitor device) 16 composed of, for example, a portable personal computer is connected to the terminal device connection unit 14e of the controller 14. The terminal device 16 is equipped with an input/output part 16a and a screen 16b and have a storage part (not shown) and an arithmetic part (not shown) that performs logical determination and arithmetic processing built-in.

The display device for monitoring 15 is connected to the monitor connection unit 14f of the controller 14. The display device for monitoring 15 has a control panel (input device) 15a and a screen 15b. The control panel 15a has a plurality of control buttons including an up button, a down button, a right button, a left button, a determination button, a return button and an end button (refer to FIG. 4). At shipment inspection of a hydraulic excavator, for example, or at the maintenance thereof after its shipment, an operator (maker's inspector or maintenance inspector) manipulates a desired control button of the control panel 15a using a screen displayed on the screen 15b to input external information to the controller 14, thereby making it possible to carry out a series of failure diagnosis processes.

The terminal device 16 can be used instead of the display device 15 or used as needed in conjunction with the display device 15. As processing modes for the information management system, for example, a "manual measurement mode" including a manual measurement by the operator and a "semi-automatic measurement mode" including an automatic measurement can be selected (this will be described later).

<Operation in Normal Control Mode>

The operations of the respective devices (swing right-and-left low-pressure relief solenoid valves 63a and 63b, relief pressure changeover valves 62a and 62b, swing right-and-left pilot pressure reducing solenoid valves 65a and 65b, etc.) at the time that the controller 14 selects the normal control mode will be described by being divided into the hydraulic electric combined swing mode and the hydraulic single swing mode. The controller 14 selects the hydraulic electric combined swing mode in normal times and switches the hydraulic electric combined swing mode to the hydraulic single swing mode when the battery 81 is fully charged, the occurrence of abnormalities in the electric system 200, and the like.

<<Hydraulic Electric Combined Swing Mode>>

<At the Control-Lever Neutral of Control Lever Device 55>

A description will first be made of a case where the controller 14 selects the hydraulic electric combined swing mode.

FIG. 2 shows a state in which in the hydraulic electric combined swing mode, the control lever of the control lever device 55 is in a neutral or center valve position (at the non-driving of the actuator).

When the control lever of the control lever device 55 is in the neutral position, the swing right and left low-pressure relief solenoid valves 63a and 63b are respectively placed in positions where output pressure is brought to tank pressure, the relief pressure changeover valves 62a and 62b are respectively pressed by springs and placed in closed positions shown in the drawing, and the low pressure relief valves 61a and 61b are respectively shut off from the actuator lines 52a and 52b connected to their corresponding ports of the swing hydraulic motor 52 and thereby placed in an inoperable state.

The signals outputted from the controller 14 to the swing right-and-left pilot pressure reducing solenoid valves 65a and 65b are OFF, and the swing right-and-left pilot pressure reducing solenoid valves 65a and 65b are placed in their corresponding positions (open positions) shown in the drawing.

<At the Input of Control Lever of Control Lever Device 55>

Since the swing right pilot pressure reducing solenoid valve 65b is in the illustrated position (open position) when the control lever of the control lever device 55 is manipulated in, for example, the right direction illustrated in the drawing, the control pilot pressure generated at the control lever device 55 is given to the pilot pressure input unit 12b on the illustrated right side of the swing directional control valve 12 as it is without any reduction in pressure, so that the swing directional control valve 12 is switched in the left direction. Thus, the swing hydraulic motor 52 is supplied with hydraulic fluid from the hydraulic pump 51 through the left actuator line 52a so that the swing hydraulic motor 52 is rotatably driven to swing the swing structure 20. Since the controller 14 selects the hydraulic electric combined swing mode at this time, the controller 14 outputs a control signal to the inverter 82. Thus the swing electric motor 53 is also rotatably driven to swing the swing structure 20 with driving forces of both the swing hydraulic motor 52 and the swing electric motor 53.

Simultaneously with the manipulation of the control lever of the control lever device 55 in the right direction, the controller 14 outputs an ON signal to the swing right low-pressure relief solenoid valve 63b, so that the swing right low-pressure relief solenoid valve 63b is changed over from the illustrated position to output control pressure, and the relief pressure changeover valve 62b is switched to the open position so that the low pressure relief valve 61b is brought to an operable state. That is, the right actuator line 52b is brought to a low-pressure relief pressure set state.

On the other hand, since the relief pressure changeover valve 62a remains in the closed position, the high pressure relief valve 57a still remains kept in an actuatable state. Thus, the left actuator line 52a is held in a high pressure relief set state.

Thus, at the startup of a swing where the control lever of the control lever device 55 is manipulated in the right direction, the pressure of the hydraulic fluid supplied to the swing hydraulic motor 52 via the left actuator line 52a is raised to set pressure of the high pressure relief valve 57a so that the swing hydraulic motor 52 generates a large driving force (torque), thereby enabling smooth and powerful activation of the swing structure 20 by the driving force of the swing hydraulic motor 52 and the driving force of the swing electric motor 53.

<At the Return Back of Control Lever Device 55>

On the other hand, when the control lever of the control lever device 55 is manipulated to return in its neutral direction in order to stop the swing structure 20, the swing hydraulic motor 52 functions as a hydraulic pump by inertial rotation of the swing structure 20 and the right actuator line 52b reaches the high pressure side. Thus, the pressure thereof (back pressure of the swing hydraulic motor 52) increases to set pressure of the low pressure relief valve 61b so that a braking force corresponding to the set pressure is generated at the swing hydraulic motor 52.

The controller 14 switches the swing electric motor 53 from a drive mode to a regenerative mode (power generation mode) to generate a braking force by power generation of the swing electric motor 53, so that the swing structure 20 is rapidly decelerated by both of the braking force based on the back pressure (pressure of actuator line 52b) of the swing hydraulic motor 52 and the braking force by the power generation of the swing electric motor 53. During this period, power produced by the power generation of the swing electric motor 53 is stored in the motor battery 81 through the inverter 82 and the power is regenerated.

When the control lever of the control lever device 55 is returned to the neutral position, the signal outputted from the controller 14 to the swing right low-pressure relief solenoid valve 63b becomes OFF so that the swing right low-pressure relief solenoid valve 63b is changed over to the illustrated position to bring the pressure on the output side to the tank pressure. Therefore, the relief pressure changeover valve 62b is switched to the closed position by a spring force so that the low pressure relief valve 61b is brought to the inoperable state. As a result, the pressure (back pressure of the swing hydraulic motor 52) of the right actuator line 52b is raised to the set pressure of the high pressure relief valve 57b so that a braking force corresponding to the set pressure is generated at the swing hydraulic motor 52. Thus, the swing hydraulic motor 52 is promptly stopped by the generated braking force and the braking force produced by the effect of the power generation of the swing electric motor 53.

<At the Manipulation of Control Lever of Control Lever Device 55 in Reverse Direction>

The operation at the time that the control lever of the control lever device 55 is manipulated in the reverse direction (left direction shown in the drawing) is also merely reversed in the right and left. The operation is substantially identical to the operation at the time the control lever is manipulated in the right direction.

<<Hydraulic Single Swing Mode>>

<At the Neutral Time of Control Lever of Control Lever Device 55>

A description will next be made of a case where the controller 14 performs switching to the hydraulic single swing mode.

In the hydraulic single swing mode, the signal outputted from the controller 14 to each of the right-and-left low-pressure relief solenoid valves 63a and 63b is OFF, and the right-and-left low-pressure relief solenoid valves 63a and 63b are respectively placed in the illustrated positions where the output pressure is taken as the tank pressure. The relief pressure changeover valves 62a and 62b are respectively pressed by their corresponding springs and held in the closed positions, and the low pressure relief valves 61a and 61b are respectively placed in an inoperable state. Therefore, both of the high pressure relief valves 57a and 57b are also respectively placed in an operable state, and both of the right and left actuator lines 52a and 52b are also respectively placed in a high pressure relief set state.

When the control lever of the control lever device 55 is in the neutral position in the hydraulic single swing mode, the signal outputted from the controller 14 to each of the swing right-and-left pilot pressure reducing solenoid valves 65a and 65b is also OFF, and the swing right-and-left pilot pressure reducing solenoid valves 65a and 65b are respectively held in the illustrated positions (open positions).

<At the Input Based on Control Lever of Control Lever Device 55>

When the control lever of the control lever device 55 is manipulated in the illustrated right direction, for example, the swing right pilot pressure reducing solenoid valve 65b is held in the illustrated position (open position). Therefore, the control pilot pressure generated at the control lever device 55 is not reduced and given to the right pilot pressure input unit 12b shown in the drawing, of the swing directional control valve 12 as it is. Thus, the swing directional control valve 12 is switched in the left direction so that hydraulic fluid is supplied to the swing hydraulic motor 52 via the left actuator line 52a. Therefore, the swing hydraulic motor 52 is rotatably driven to swing the swing structure 20.

At this time, both of the right and left actuator lines are also respectively in the high pressure relief set state. Therefore, when the swing startup is done where the control lever of the control lever device 55 is manipulated in the illustrated right direction, the pressure of the hydraulic fluid supplied to the swing hydraulic motor 52 via the left actuator line 52a increases to the set pressure of the high pressure relief valve 57a, and the swing hydraulic motor 52 generates a large driving force (torque), thereby enabling a smooth startup of the swing structure 20.

<At the Returning Back of Control Lever of Control Lever Device 55>

On the other hand, when the control lever of the control lever device 55 is operated so as to be returned in the neutral direction in order to stop the swing structure 20, the swing hydraulic motor 52 functions as a hydraulic pump by inertial rotation of the swing structure 20, and the right actuator line 52b reaches the high pressure side so that its pressure (back pressure of the swing hydraulic motor 52) increases. At this time, simultaneously with the operation of returning back the control lever of the control lever device 55 in the neutral direction, the controller 14 outputs a drive signal to the swing right pilot pressure reducing solenoid valve 65*b*, so that the swing right pilot pressure reducing solenoid valve 65*b* is operated based on the drive signal to reduce control pilot pressure and output it. Thus, since the stroke of the swing directional control valve 12 is reduced and an open area at the meter-out is reduced, the pressure (back pressure of swing hydraulic motor 52) of the right actuator line 52*b* is raised rapidly as compared with no reduction in the control pilot pressure during a period taken till when the pressure (back pressure of swing hydraulic motor 52) of the right actuator line 52*b* is raised to the set pressure of the high pressure relief valve 57*b*, thereby reliably increasing a braking force given to the swing hydraulic motor 52.

Thereafter, when the pressure (back pressure of swing hydraulic motor 52) of the right actuator line 52*b* rises to the set pressure of the high pressure relief valve 57*b*, a large braking force corresponding to the set pressure of the high pressure relief valve 57*b* is generated at the swing hydraulic motor 52.

When the control lever of the control lever device 55 is returned to the neutral position, the signal outputted from the controller 14 to the swing left pilot pressure reducing solenoid valve 65*b* becomes OFF so that the swing left pilot pressure reducing solenoid valve 65*b* is returned to the illustrated open position.

The pressure (back pressure of swing hydraulic motor 52) of the right actuator line 52*b* remains raised to the set pressure of the high pressure relief valve 57*b*. A large braking force corresponding to the set pressure indicative of its high pressure is generated at the swing hydraulic motor 52 and hence the swing hydraulic motor 52 stops promptly.

It is thus possible to smoothly stop the swing structure 20 even in the hydraulic single swing mode.

<<Operation of Swing Parking Brake 54>>

Even in both of the above-described hydraulic electric combined swing mode and hydraulic single swing mode, when control lever of the control lever device 55 is operated and thereby control pilot pressure is generated, the pilot pressure is selected by the shuttle valve 56 and supplied to the brake release cylinder 54*b* of the swing parking brake 54. As a result, the braking of the swing parking brake 54 is released so that the swing structure 20 is brought to a pivotable state. When the control lever of the swing lever device 55 is returned to the neutral, the supply of the control pilot pressure from the control lever device 55 is stopped and hydraulic fluid in a brake chamber of the brake release cylinder 54*b* passes into the tank via a restrictor 54*c* of a path provided in parallel with a path of the check valve 54*a*. After the control lever has been reset to the neutral position, the swing parking brake 54 is brought to a braked state at approximately 5 to 7 seconds and hence the swing structure 20 is stopped.

In the hydraulic electric combined swing mode, the swing structure 20 is swung by both driving forces of the swing hydraulic motor 52 and the swing electric motor 53. At this time, in case that the driving force of the swing electric motor 53 is increased due to some cause, large swing torque is generated unintentionally. The emergency stop valve 68 is provided to cope with such a case. When the operator manipulates the unillustrated emergency stop lever (gate lock lever, for example), the switch 71 is closed so that the emergency stop valve 68 is changed over from the illustrated closed position to open position. Thus, the hydraulic fluid of the brake release cylinder 54*b* of the swing parking brake 54 is evacuated instantaneously. After the emergency stop lever has been manipulated, a brake is applied in nearly 0.5 seconds.

[Failure Diagnosis Function and Operation of Information Management System]

A description will next be made of a failure diagnosis function of the information management system according to the present embodiment and its operation using FIGS. 4 through 22.

<Transition to Failure Diagnosis Mode>

Figure 4:
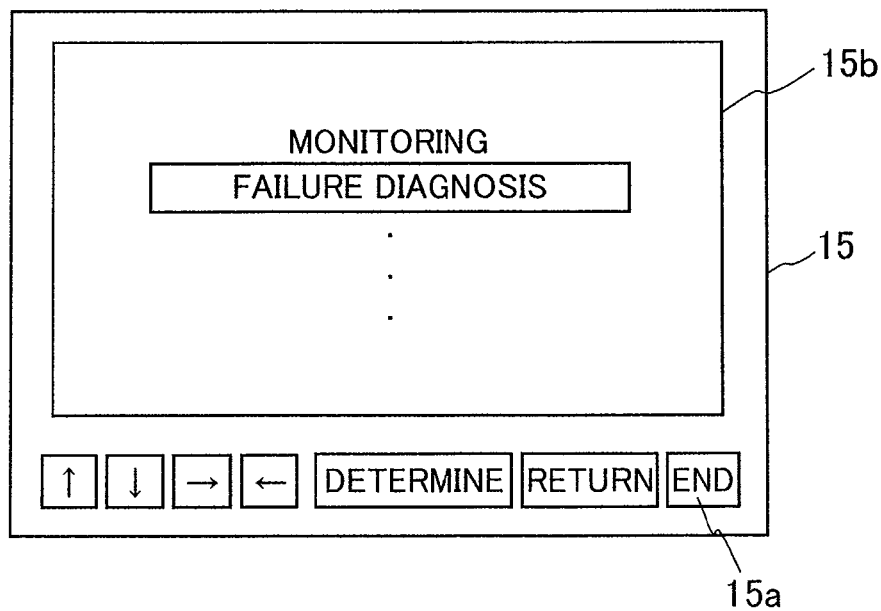
FIG. 4 is a diagram illustrating a selection screen in a failure diagnosis mode, which is displayed on the screen of a display device.
Figure 12:
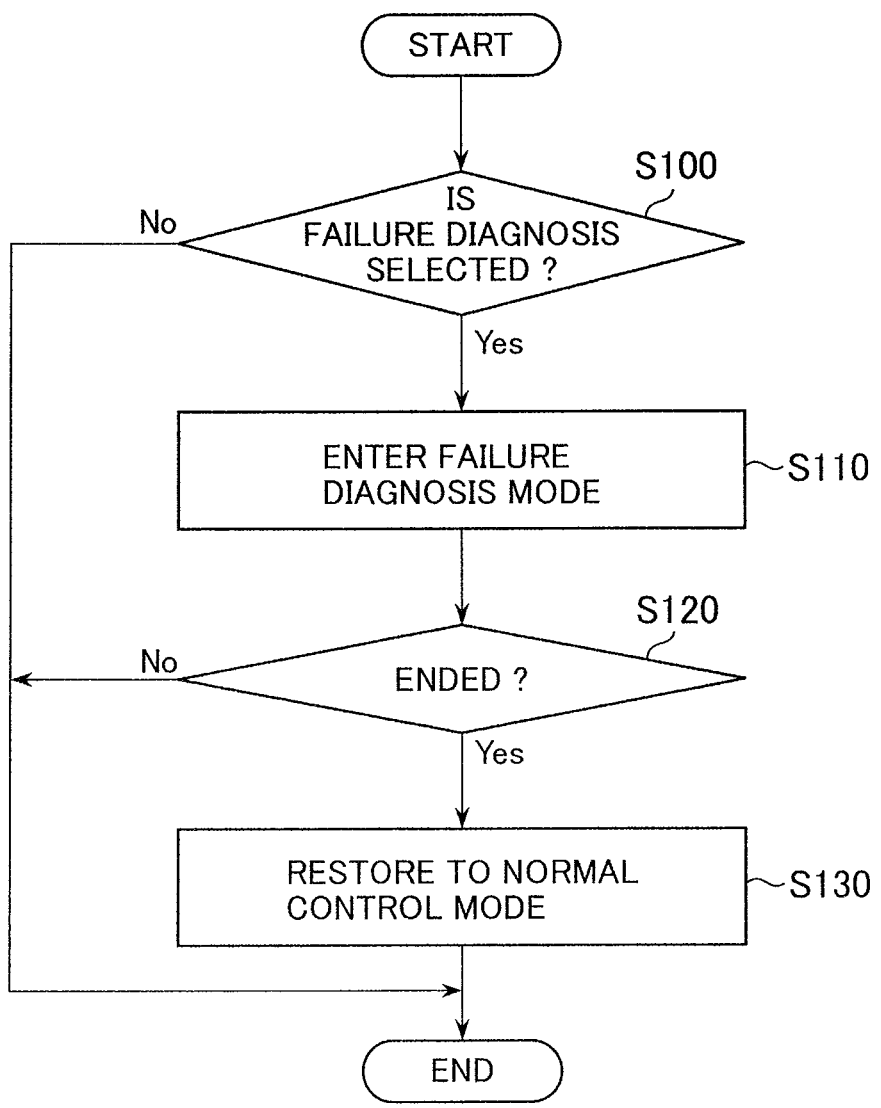
FIG. 12 is a flowchart showing a processing function of the controller when the selection screen of FIG. 4 is operated.

FIG. 4 is a diagram showing a selection screen in a failure diagnosis mode displayed on the screen 15*b* of the display device 15. FIG. 12 is a flowchart showing a processing function of the controller 14 at the time that the selection screen of FIG. 4 is operated.

As shown in FIG. 4, a selection menu for various functions is displayed on the selection screen. The selection menu includes items such as "monitoring", "failure diagnosis", etc. When an operator highlight-selects "failure diagnosis" with an up-and-down button for the input of each operation of the control panel 15*a* and presses a determination button upon shipment inspection of a hydraulic excavator, for example, the controller 14 enters from the normal control mode to the failure diagnosis mode so that a window screen in the screen 15*b* is transitioned to a lower failure diagnosis menu screen (FIG. 5) (Step S100→S110). In the failure diagnosis mode, the control in the normal control mode is made ineffective. After the transition to the lower screen in the failure diagnosis mode, the operator presses an end button on the control panel 15*a*. Consequently, the controller 14 is restored from the failure diagnosis mode to the normal control mode so that the window screen in the screen 15*b* is transitioned to the selection screen shown in FIG. 4 (Step S120→S130). When the failure diagnosis mode is restored to the normal control mode, the control in the normal control mode is rendered effective again.

<Summary of Failure Diagnosis Processing>

Figure 5:
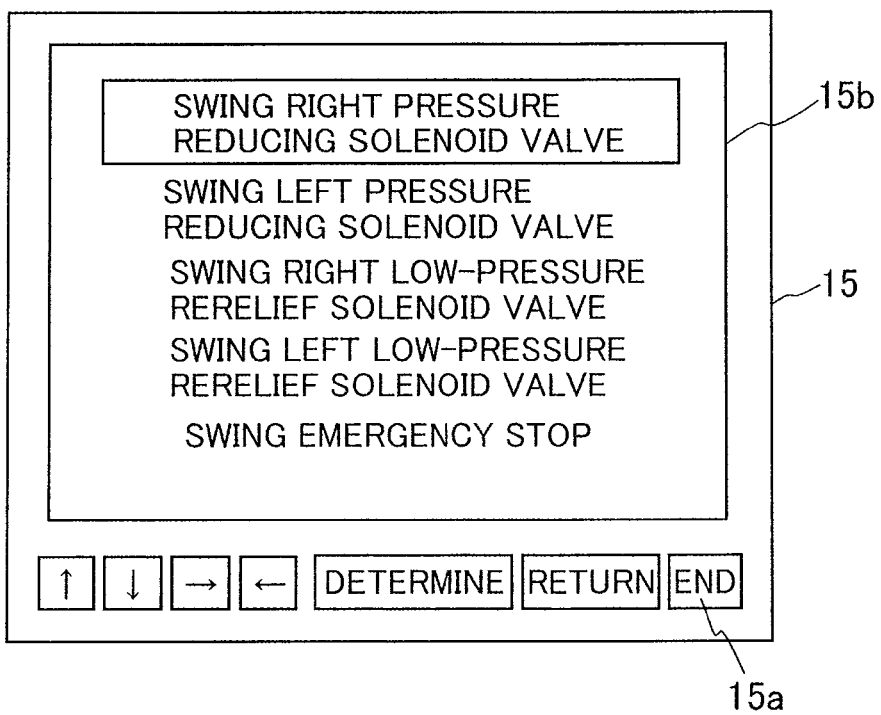
FIG. 5 is a diagram showing a failure diagnosis menu screen used as an initial screen.
Figure 13:
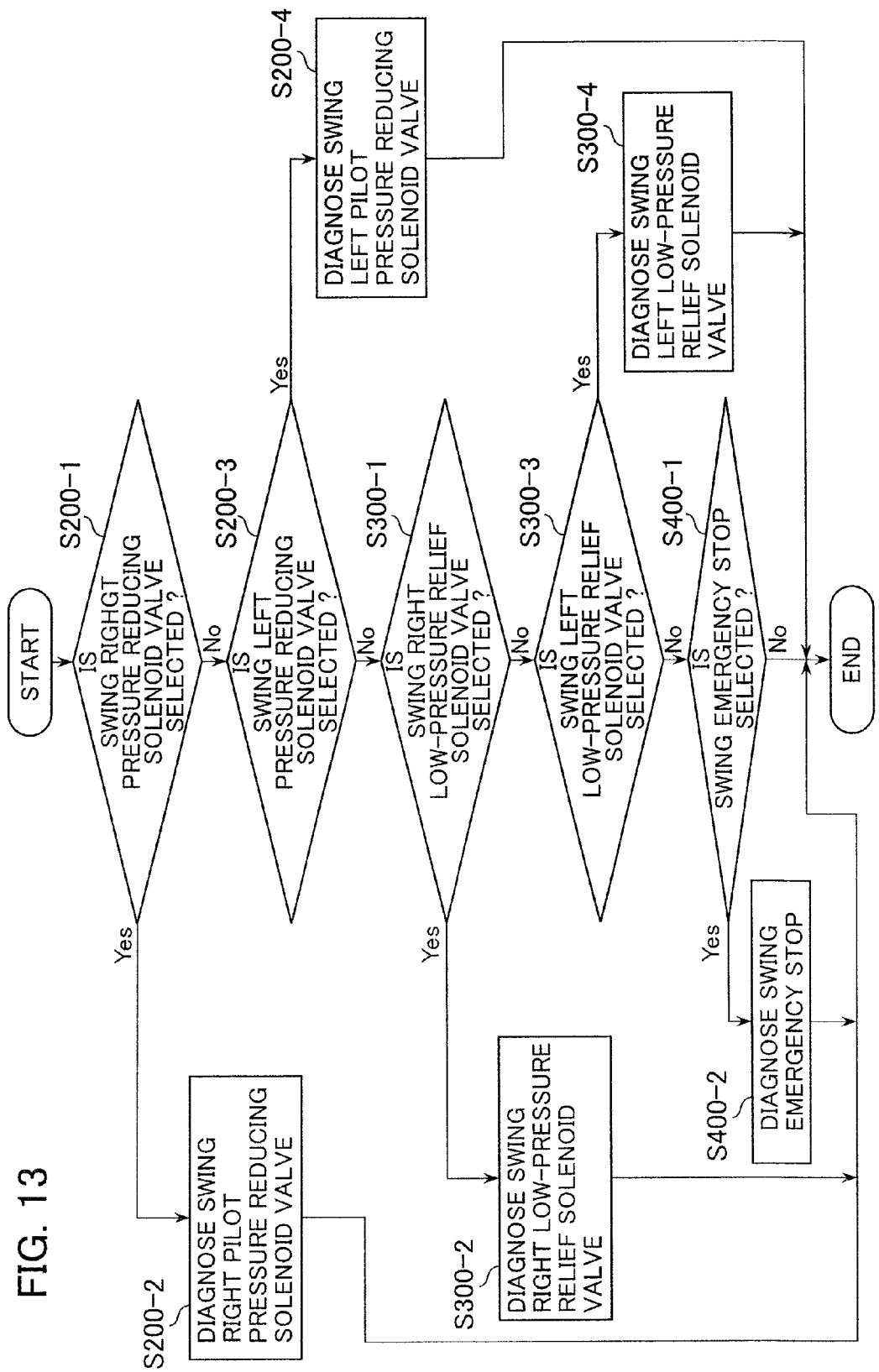
FIG. 13 is a flowchart showing a processing function of the controller when the failure diagnosis menu screen of FIG. 5 is operated.

FIG. 5 is a diagram showing a failure diagnosis menu screen used as an initial screen, which is transitioned when in the selection screen of FIG. 4, the "failure diagnosis" is highlight-selected with the up-and-down button for the input of each operation of the control panel 15*a* and the determination button is pressed. FIG. 13 is a flowchart showing a processing function of the controller 14 when the failure diagnosis menu screen of FIG. 5 is operated.

As shown in FIG. 5, menu items of a "swing right pressure reducing solenoid valve", a "swing left pressure reducing solenoid valve", a "swing right low-pressure relief solenoid valve", a "swing left low-pressure relief solenoid valve", and a "swing emergency stop" are displayed on the failure diagnosis menu screen. The "swing right pressure reducing solenoid valve" is a menu item for diagnosis related to the swing right pilot pressure reducing solenoid valve 65*b*. The "swing left pressure reducing solenoid valve" is a menu item for diagnosis related to the swing left pilot pressure reducing solenoid valve 65*a*. The "swing right low-pressure relief solenoid valve" is a menu item for diagnosis related to the low-pressure right relief pressure reducing solenoid valve 63*b*. The "swing left low-pressure relief solenoid valve" is a menu item for diagnosis related to the low-pressure left relief pressure reducing solenoid valve 63*a*. The "swing emergency stop" is a menu item for diagnosis related to the swing emergency stop valve 68.

When the operator highlight-selects a menu item desired to be diagnosed using the up-and-down button for the input of each operation of the control panel 15*a* and presses a determination button, the controller 14 starts up a corresponding failure diagnosis function. The window screen in the screen 15*b* is transitioned to the lower diagnosis screen.

That is, when the operator highlight-selects the "swing right pressure reducing solenoid valve" and presses the determination button as shown in FIG. 5, the window screen in the screen 15*b* is transitioned to the lower diagnosis screen (FIG. 6A), and the controller 14 starts up a failure diagnosis function (FIG. 14) of a system for the swing right pilot pressure reducing solenoid valve 65*b* (Step S200-1→S200-2 in FIG. 13). This is similar even where the "swing left pressure reducing solenoid valve" is highlight-selected and the determination button is pressed. The window screen in the screen 15*b* is transitioned to the lower diagnosis screen. The controller 14 starts up a failure diagnosis function of a system for the swing left pilot pressure reducing solenoid valve 65*a* (Step S200-3→S200-4 in FIG. 13).

Figure 7:
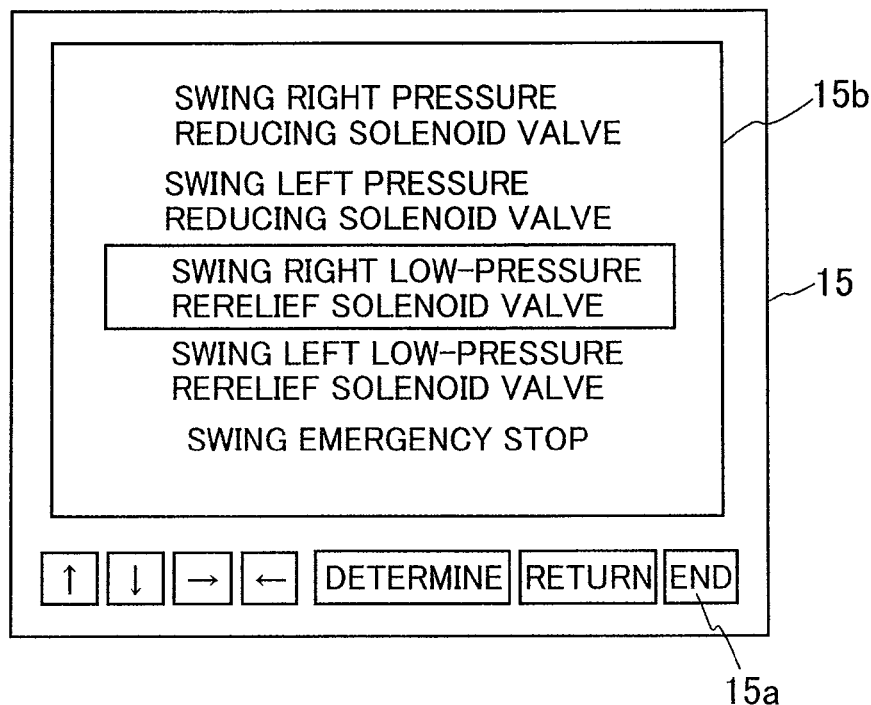
FIG. 7 is a diagram showing a failure diagnosis menu screen where a "swing right low-pressure relief solenoid valve" is highlight-selected.

When the operator highlight-selects the "swing right low-pressure relief solenoid valve" and presses the determination button as shown in FIG. 7, the window screen in the screen 15*b* is transitioned to the lower diagnosis screen (FIG. 8), and the controller 14 starts up a failure diagnosis function (FIG. 15) of a system for the swing right low-pressure relief solenoid valve 63*b* (Step S300-1→S300-2). This is similar even to the case where the "swing left low-pressure relief solenoid valve" is highlight-selected and the determination button is pressed. The window screen in the screen 15*b* is transitioned to the lower diagnosis screen, and the controller 14 starts up a failure diagnosis function of a system for the swing left low-pressure relief valve 63*a* (Step S300-3→S300-4).

Figure 9:
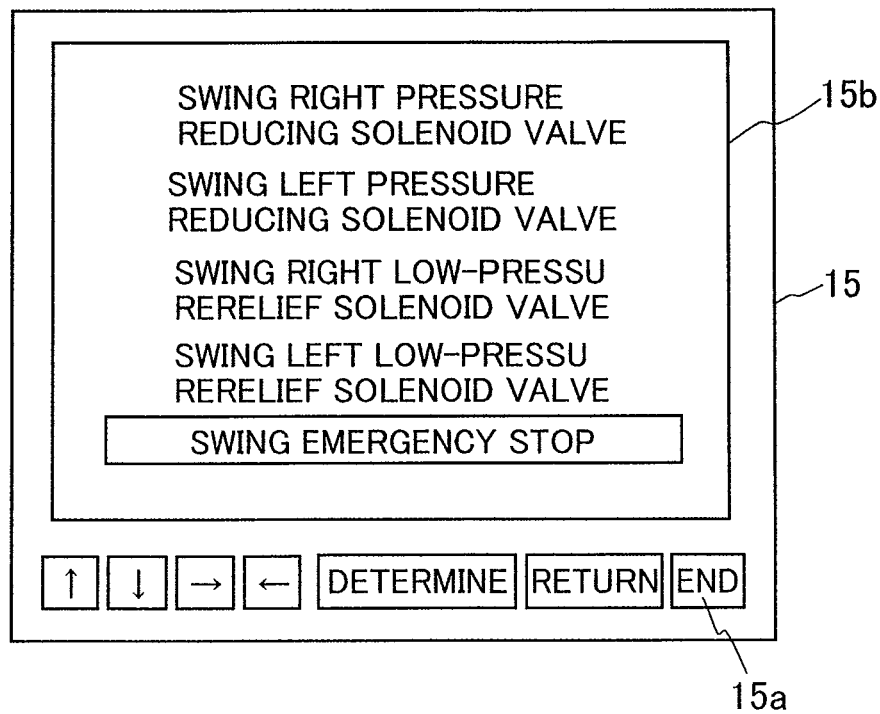
FIG. 9 is a diagram illustrating a failure diagnosis menu screen where a "swing emergency stop" is highlight-selected.

When the operator highlight-selects the "swing emergency stop" and presses the determination button as shown in FIG. 9, the window screen in the screen 15*b* is transitioned to a lower diagnosis screen (FIG. 10), and the controller 14 starts up a failure diagnosis function (FIG. 16) of a system for the emergency stop valve 68 (Step S400-1→S400-2).

As described above herein, the failure diagnosis mode includes a "manual measurement mode" including a manual measurement by the operator, for example, and a "semiautomatic measurement mode" including an automatic measurement, for example. The operator is able to select either the "manual measurement mode" or the "semiautomatic measurement mode" according to how to press, for example, a button for the input of each operation.

The details of the failure diagnosis functions for the "swing right pressure reducing solenoid valve", the "swing left pressure reducing solenoid valve", the "swing right low-pressure relief solenoid valve", the "swing left low-pressure relief solenoid valve", and the "swing emergency stop" will hereinafter be described by being divided into the "manual measurement mode" and the "semiautomatic measurement mode".

<<Manual Measurement Mode>>

A description will first be made of the "manual measurement mode".

<Failure Diagnosis Function for "Swing Right Pressure Reducing Solenoid Valve">

Figure 6A:
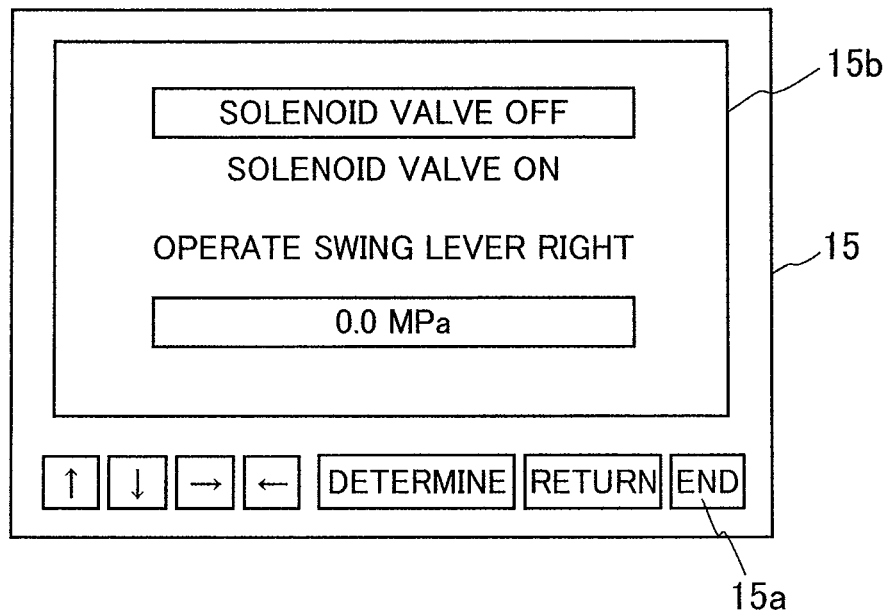
FIG. 6A is a failure diagnosis screen transitioned at Step S200-2 of FIG. 13 when an operator highlight-selects a "swing right pressure reducing solenoid valve" and presses a determination button as shown in FIG. 5.
Figure 6B:
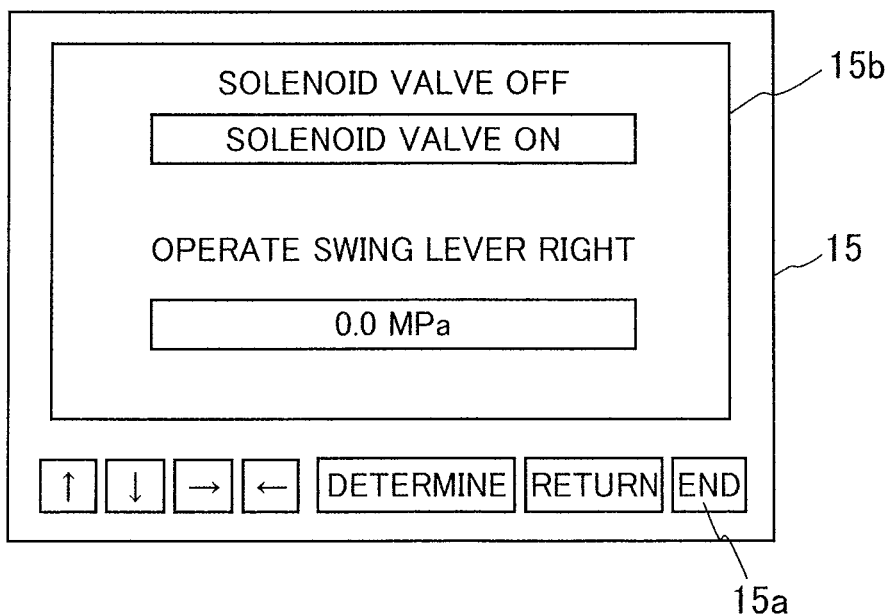
FIG. 6B is a failure diagnosis screen where a solenoid valve ON is highlight-selected in FIG. 6A.

FIG. 6A is a diagnosis screen transitioned at Step S200-2 of FIG. 13 when the operator highlight-selects the "swing right pressure reducing solenoid valve" and presses the determination button as shown in FIG. 5. FIG. 6B is a diagnosis screen where the "solenoid valve ON is highlight-selected in FIG. 6A. Likewise, as described above, FIG. 14 is a flowchart showing the failure diagnosis function started up at Step S200-2 of FIG. 13 when the "swing right pressure reducing solenoid valve" is highlight-selected and the determination button is pressed.

A selection menu for "solenoid valve OFF" and "solenoid valve ON", a guidance for "operate swing lever right", and a monitor region indicating swing pilot pressure detected by the pilot pressure sensor 66*a* (swing left) or 66*b* (swing right) in numerical values are displayed on the diagnosis screen of FIG. 6A.

<Selection of "Solenoid Valve Off">

Figure 14:
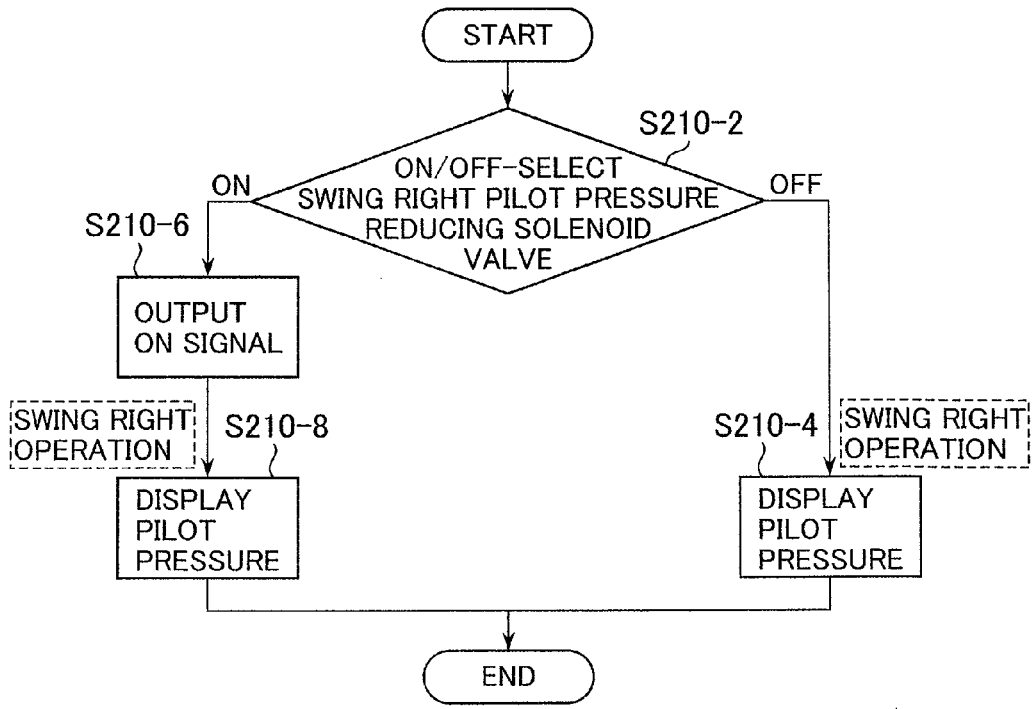
FIG. 14 is a flowchart showing a failure diagnosis function started up at Step S200-2 of FIG. 13 when the "swing right pressure reducing solenoid valve" is highlight-selected and the determination button is pressed.

First when the operator highlight-selects the "solenoid valve OFF" and presses the determination button as shown in FIG. 6A, the controller 14 outputs an OFF signal to the swing right pilot pressure reducing solenoid valve 65*b* (without outputting a drive signal) and brings swing pilot pressure at that time detected by the swing right pilot pressure sensor 66*b* into a state indicating it in numerical values in the monitor region of the diagnosis screen of FIG. 6A (Step S210-2→S210-4 in FIG. 14). When the control lever of the control lever device 55 is not operated, the swing pilot pressure detected by the swing right pilot pressure sensor 66*b* is tank pressure. For example, 0.0 MPa is displayed in the monitor region.

Next, the operator fully operates the control lever of the control lever device 55 in the illustrated right direction of FIG. 2 in accordance with the guidance of FIG. 6A. At this time, no drive signal is outputted to the swing right pilot pressure reducing solenoid valve 65*b* and hence the swing right pilot pressure reducing solenoid valve 65*b* is held in the open position without its operation. Therefore, if the right pilot valve provided in the control lever device 55 is normal, the swing right pilot pressure reducing solenoid valve 65*b* outputs a control pilot pressure near 4.0 MPa being prescribed pressure, and the right control pilot pressure is given to the pilot pressure input unit 12*b* on the right side shown in the drawing, of the swing directional control valve 12 as it is without a reduction in its pressure, so that the swing directional control valve 12 is switched in the left direction. The right control pilot pressure generated at the right pilot valve of the control lever device 55 is selected by the shuttle valve 56 and given to the brake relief cylinder 54*b* of the swing parking brake 54, so that the braking of the swing parking brake 54 is released to bring the swing structure 20 into a pivotable state. As a result, hydraulic fluid from the hydraulic pump 51 is supplied to the swing hydraulic motor 52 via the left actuator line 52*a* so that the swing hydraulic motor 52 is rotatably driven to swing the swing structure 20.

The right control pilot pressure generated at the control lever device 55 is detected by the swing right pilot pressure sensor 66*b*. The controller 14 displays the detected control pilot pressure in the monitor region of the diagnosis screen of FIG. 6A numerically (Step S210-4 of FIG. 14).

The operator confirms whether when the control lever of the control lever device 55 is fully operated in the illustrated right direction, the swing structure 20 is swung and to which value the numerical value of the right control pilot pressure displayed in the monitor region of the diagnosis screen corresponds.

If the right pilot valve provided in the control lever device 55 is normal when the control lever of the control lever device 55 is fully operated in the illustrated right direction here, a control pilot pressure near 4.0 MPa corresponding to prescribed pressure is outputted. If the swing right pilot pressure sensor 66*b* is normal, then a value near 4.0 MPa is displayed in the monitor region of the diagnosis screen.

If the swing structure 20 swings and the numerical value of the right control pilot pressure displayed in the monitor region of the diagnosis screen is a value near 4.0 MPa being of prescribe pressure, e.g., a value higher than 3.5 MPa, then the operator determines that the right pilot valve of the control lever device 55 and the swing right pilot pressure sensor 66b are both normal. Except for it, it is determined that a malfunction has occurred in either one of the right pilot valve of the control lever device 55 and the swing right pilot pressure sensor 66b. When, for example, the swing structure 20 is not swung properly, the numerical value of the right control pilot pressure displayed in the monitor region of the diagnosis screen is a value higher than 3.5 MPa or if the numerical value of the right control pilot pressure displayed in the monitor region of the diagnosis screen is not greater than 3.5 MPa despite the swing structure 20 is properly swung, it is determined that a malfunction has occurred in the swing right pilot pressure sensor 66b. If the swing structure 20 is not properly swung and the numerical value of the right control pilot pressure displayed in the monitor region of the diagnosis screen is not greater than 3.5 MPa, it is then determined that a malfunction occurs in the right pilot valve of the control lever device 55.

When it is determined that the malfunction has occurred in either of the right pilot valve and the swing right pilot pressure sensor 66b or both of them, its malfunction is resolved by performing the replacement of components or parts of the corresponding device or the device itself, and the like.

Thus, in the diagnosis screen of FIG. 6A, the "solenoid valve OFF" is selected and the determination button is pressed, and the control lever of the control lever device 55 is fully operated in the illustrated right direction of FIG. 2. It is thus possible to determine whether the right pilot valve and the swing right pilot pressure sensor 66b are normal or abnormal.

<Selection of "Solenoid Valve On">

Next, when the operator highlight-selects the "solenoid valve ON" and presses the determination button as shown in FIG. 6B, the controller 14 outputs an ON signal (maximum drive signal) for fully opening the swing right pilot pressure reducing solenoid valve 65b to the solenoid valve 65b and brings swing pilot pressure at that time detected by the swing right pilot pressure sensor 66b into a state indicating it in numerical values in the monitor region of the diagnosis screen of FIG. 6B (Step S210-2→S210-6→Step S210-8 in FIG. 14). When the control lever of the control lever device 55 is not operated, the swing pilot pressure detected by the swing right pilot pressure sensor 66b is tank pressure. For example, 0.0 MPa is displayed in the monitor region if the swing right pilot pressure sensor 66b is normal.

Next, the operator fully operates the control lever of the control lever device 55 in the illustrated right direction of FIG. 2, for example, in accordance with the guidance of FIG. 6B. At this time, the maximum drive signal is outputted to the swing right pilot pressure reducing solenoid valve 65b. Therefore, if the swing right pilot pressure reducing solenoid valve 65b is normal, then the swing right pilot pressure reducing solenoid valve 65b is operated to take a fully closed state. Thus, the right control pilot pressure generated at the control lever device 55 is shut off so that the swing directional control valve 12 is held in its neutral position. As a result, no hydraulic fluid is supplied from the hydraulic pump 51 to the swing hydraulic motor 52. Hence the swing hydraulic motor 52 is not rotatably driven so that the swing structure 20 is not swung.

The right control pilot pressure generated at the control lever device 55 is detected by the swing right pilot pressure sensor 66b. The controller 14 displays the detected control pilot pressure in the monitor region of the diagnosis screen of FIG. 6A numerically (Step S210-8 of FIG. 14).

The operator confirms whether when the control lever of the control lever device 55 is fully operated in the illustrated right direction, the swing structure 20 is swung and to which value the numerical value of the right control pilot pressure displayed in the monitor region of the diagnosis screen corresponds.

Since the swing right pilot pressure reducing solenoid valve 65b is held in the fully closed state if it is normal when the control lever of the control lever device 55 is fully operated in the illustrated right direction, the swing structure 20 is not swung. Preferably, the failure diagnosis of the "solenoid valve ON" described herein is assumed to be carried out after it has been confirmed that it is the above-described failure diagnosis of "solenoid valve OFF" and the right pilot valve and the swing right pilot pressure sensor 66b are normal. If done in this way, it is then possible to diagnose whether the swing right pilot pressure reducing solenoid valve 65b is normal or abnormal at the failure diagnosis of the "solenoid valve ON".

If the swing structure 20 is not swung and the numerical value of the right control pilot pressure displayed in the monitor region of the diagnosis screen is a value near 4.0 MPa being of prescribed pressure, e.g., a value higher than 3.5 MPa, then the operator determines that the swing right pilot pressure reducing solenoid valve 65b is normal. If the swing structure 20 is swung, it is then determined that a malfunction occurs in the swing right pilot pressure reducing solenoid valve 65b.

Thus, after it has been confirmed that the swing right pilot valve and the swing right pilot pressure sensor 66b are normal at the failure screen of FIG. 6A, the operator selects the "solenoid valve ON" and presses the determination button, and fully operates the control lever of the control lever device 55 in the illustrated right direction of FIG. 2. It is consequently possible to determine whether the swing right pilot pressure reducing solenoid valve 65b is normal or abnormal.

<Failure Diagnosis Function of "Swing Left Pressure Reducing Solenoid Valve">

The failure diagnosis function for the "swing left pressure reducing solenoid valve" is substantially identical to the above-described failure diagnosis function of "swing right pressure reducing solenoid valve" except that the "right" is replaced with the "left" in FIGS. 6A and 6B and FIG. 14. At the diagnosis screen, the "solenoid valve OFF" is selected and the determination button is pressed. Then, the control lever of the control lever device 55 is fully operated in the illustrated left direction of FIG. 2. It is thus possible to determine if the left pilot valve and the swing left pilot pressure sensor 66a are normal or abnormal. After it has been confirmed that the swing left pilot valve and the swing left pilot pressure sensor 66a are normal, the "solenoid valve ON" is selected and the determination button is pressed, and the control lever of the control lever device 55 is fully operated in the illustrated left direction of FIG. 2. It is thus possible to determine whether the swing left pilot pressure reducing solenoid valve 65a is normal or abnormal.

<Failure Diagnosis Function of "Swing Right Low-Pressure Relief Solenoid Valve">

Figure 8:
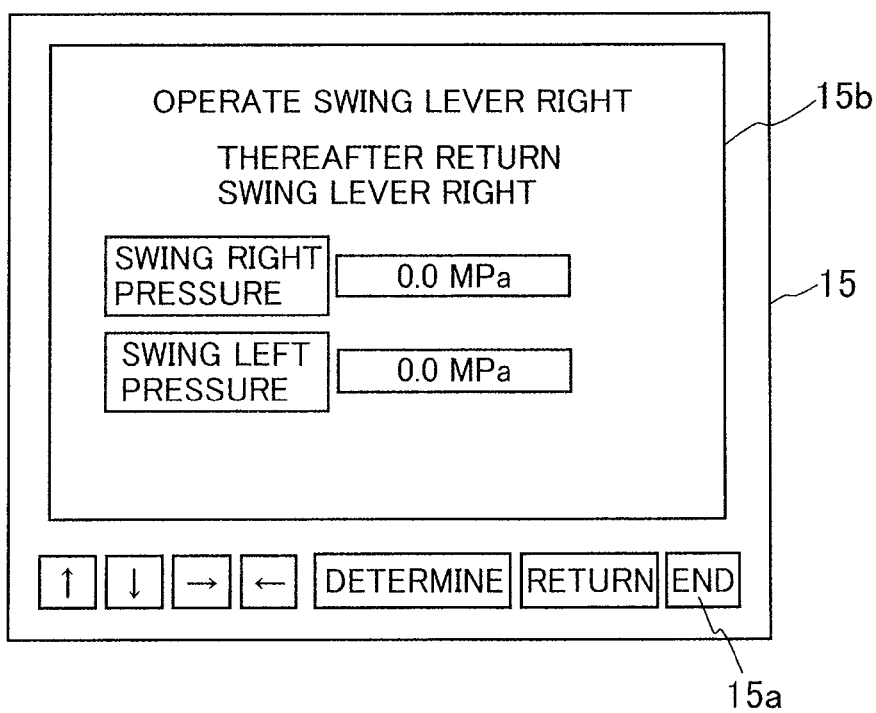
FIG. 8 is a failure diagnosis screen transitioned at Step S300-2 of FIG. 13 when the operator highlight-selects the "swing right low-pressure relief solenoid valve" and presses the determination button as shown in FIG. 7.

FIG. 8 is a diagnosis screen transitioned at Step S300-2 of FIG. 13 when the operator highlight-selects the "swing right low-pressure relief solenoid valve" and presses the determination button as shown in FIG. 7. Likewise as mentioned above, FIG. 15 is a flowchart showing a failure diagnosis function started up at Step S300-2 of FIG. 13 when the "swing right low-pressure reducing solenoid valve" is highlight-selected and the determination button is pressed.

A guidance indicative of "operate swing lever right and thereafter return swing lever right", and monitor regions for "swing right pressure" and "swing left pressure" indicating the pressure of the left actuator line 52a and the pressure of the right actuator line 52b in numerical values are displayed on the diagnosis screen of FIG. 8.

As described above, when the control lever of the control lever device 55 is not manipulated, the right-and-left low-pressure relief solenoid valves 63a and 63b are placed in the positions where the output pressure is taken as the tank pressure, the relief pressure changeover valves 62a and 62b are pressed by their corresponding springs and placed in the illustrated closed positions, and the low pressure relief valves 61a and 61b are shut off from the actuator lines 52a and 52b connected to the ports of the swing hydraulic motor 52 and held in the inoperable state. When the swing hydraulic motor 52 is not rotatably driven, the pressures of the left actuator line 52a and the right actuator line 52b are respectively the tank pressure, and for example, 0.0 MPa is displayed in the monitor regions for the "swing right pressure" and "swing left pressure".

Figure 15:
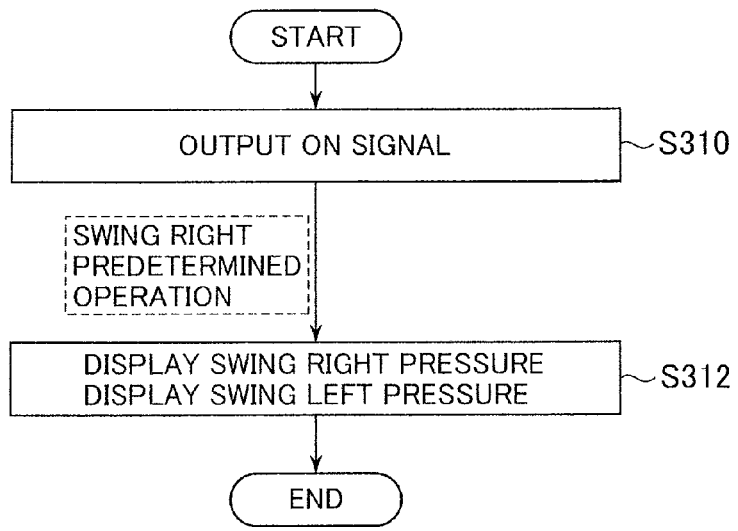
FIG. 15 is a flowchart depicting a failure diagnosis function started up at Step S300-2 of FIG. 13 when the "swing right pressure reducing solenoid valve" is highlight-selected and the determination button is pressed.
Figure 16:
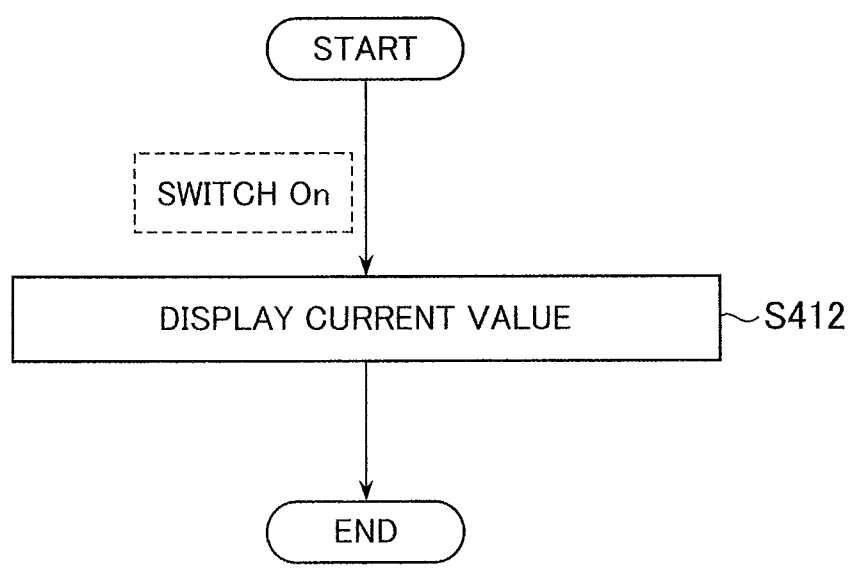
FIG. 16 is a flowchart showing a failure diagnosis function started up at Step S400-2 of FIG. 13 when the "swing emergency stop is highlight-selected and the determination button is pressed.

When the operator highlight-selects the "swing right low-pressure relief solenoid valve" and presses the determination button as shown in FIG. 7, the window screen in the screen 15b is transitioned to the diagnosis screen of FIG. 8 and at the same time the controller 14 outputs an ON signal (maximum drive signal) to the swing right low-pressure relief solenoid valve 63b (Step S310 of FIG. 15). At this time, the swing right low-pressure relief solenoid valve 63b is switched from the illustrated position to output control pressure, and the relief pressure changeover valve 62b is switched to the open position so that the low pressure relief valve 61b is brought to an operable state. That is, the right actuator line 52b is brought to a low pressure relief pressure set state. On the other hand, since the relief pressure changeover valve 62a remains in the closed state, the high pressure relief valve 57a is still held in an actuatable state and hence the left actuator line 52a is placed in a high pressure relief pressure set state.

Next, when the operator fully operates the control lever of the control lever device 55 in step form in the illustrated right direction of FIG. 2 in accordance with the guidance of FIG. 8, the swing directional control valve 12 is switched in the left direction so that the swing hydraulic motor 52 is rotatably driven to swing the swing structure 20. At the swing startup, the left actuator line 52a is raised to the set pressure of the high pressure relief valve 57a so that a driving force corresponding to the set pressure is generated at the swing hydraulic motor 52. Next, when the operator returns the control lever of the control lever device 55 in the neutral direction in step form in accordance with the guidance of FIG. 8, the pressure (back pressure of swing hydraulic motor 52) of the right actuator line 52b increases to the set pressure of the low pressure relief valve 61b so that a braking force corresponding to the set pressure is generated at the swing hydraulic motor 52.

The pressures of the actuator lines 52a and 52b are detected by the swing right-and-left pressure sensors 64a and 64b. The controller 14 displays the detected pressures of actuator lines 52a and 52b in the monitor regions for the "swing right pressure" and "swing left pressure" in the diagnosis screen of FIG. 8 in numerical values (Step S310→S312 in FIG. 15).

If the pressure displayed in the monitor region for the "swing right pressure" in the diagnosis screen of FIG. 8 is a value near the set pressure of the low pressure relief valve 61b at the time of pivotal braking at which the control lever of the control lever device 55 is returned in the neutral direction in step form, any of the swing right low-pressure relief solenoid valve 63b, the relief pressure changeover valve 62b and the low pressure relief valve 61b is determined to be normal. Except for it, it is determined that a malfunction occurs in any of the swing right low-pressure relief solenoid valve 63b, the relief pressure changeover valve 62b and the low pressure relief valve 61b.

When it is determined that the malfunction occurs in any of the swing right low-pressure relief solenoid valve 63b, the relief pressure changeover valve 62b and the low pressure relief valve 61b, the malfunction is resolved by performing the replacement of parts of equipment or the equipment itself, and the like.

Thus, at the diagnosis screen of FIG. 8, the control lever of the control lever device 55 is fully operated in the illustrated right direction of FIG. 2 in step form to take a swing startup. Thereafter, the control lever of the control lever device 55 is returned in the neutral direction in step form to perform swing braking, thereby making it possible to determine whether the swing right low-pressure relief solenoid valve 63b, the relief pressure changeover valve 62b and the low pressure relief valve 61b are normal or abnormal.

<Failure Diagnosis Function of "Swing Left Low-Pressure Relief Solenoid Valve">

The failure diagnosis function for the "swing left low-pressure relief solenoid valve" is substantially identical to the above-described failure diagnosis function of "swing right low-pressure relief solenoid valve" except that the "right" changes to the "left" and the "left" changes to the "right" in FIGS. 8 and 15. The control lever of the control lever device 55 is fully operated in the illustrated left direction of FIG. 2 in step form to take a pivotal startup, and thereafter the control lever of the control lever device 55 is returned in the neutral direction in step form to perform pivotal braking, thereby making it possible to determine whether the swing left low-pressure relief solenoid valve 63a, the relief pressure changeover valve 62a and the low pressure relief valve 61a are normal or abnormal.

<Failure Diagnosis Function of "Swing Emergency Stop">

Figure 10:
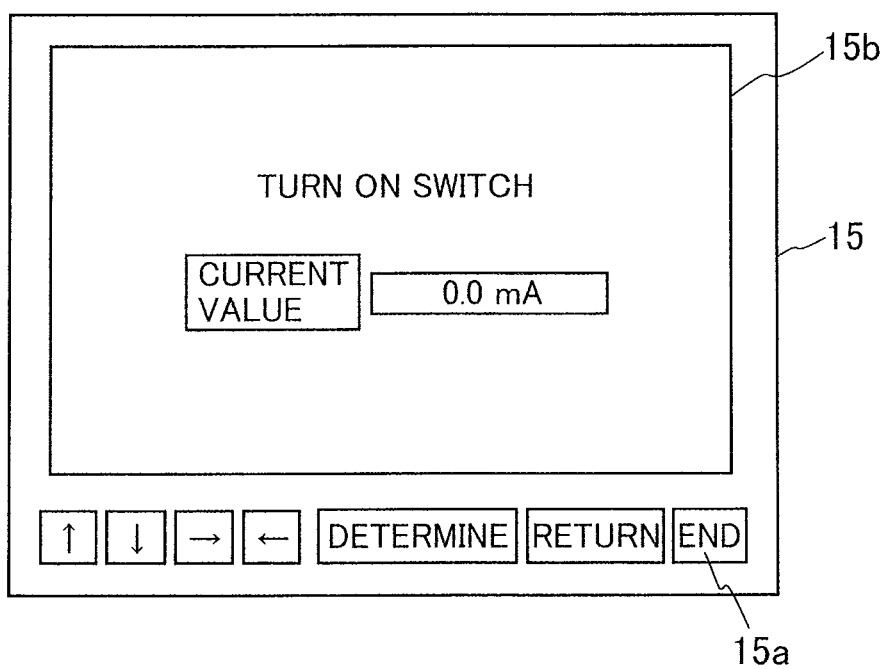
FIG. 10 is a failure diagnosis screen transitioned at Step S400-2 of FIG. 13 when the operator highlight-selects the "swing emergency stop" and presses the determination button as shown in FIG. 9.

FIG. 10 is a diagnosis screen transitioned at Step S400-2 of FIG. 13 when the operator highlight-selects the "swing emergency stop" and presses the determination button as shown in FIG. 9. Likewise as described above, FIG. 16 is a flowchart showing a failure diagnosis function started up at Step S400-2 of FIG. 13 when the "swing emergency stop" is highlight-selected and the determination button is pressed.

A guidance for "turn ON switch" and a monitor region of "current value" in which a current detected by the current sensor 73 and flowing through the power supply line of the emergency stop valve 68 is expressed numerically, are displayed on the diagnosis screen of FIG. 10.

When the operator turns ON the switch 71 in accordance with the guidance of FIG. 10, electric current flows through the power line of the emergency stop valve 68. The current is detected by the current sensor 73, and the controller 14 displays the detected current in the monitor region of "current value" in the diagnosis screen of FIG. 10 in numerical values (Step S412 of FIG. 16).

When the switch 71 is turned ON, the operator determines that the swing emergency stop valve 68 is normal if the current indicated in the monitor region of "current value" in the diagnosis screen of FIG. 10 is a value near a predetermined value. If the current is of a value smaller than the prescribed value, it is then determined that a malfunction occurs in the swing emergency stop valve 68. When it is determined that the malfunction has occurred in the swing emergency stop valve 68, the malfunction is resolved by performing the replacement of parts and the like.

Thus, the normality or abnormality of the swing emergency stop valve 68 can be judged on the diagnosis screen of FIG. 10 by turning ON the switch 71.

Incidentally, as the need arises, the value detected by the swing brake pressure sensor 67 when the control lever device 55 is operated, can be displayed on the diagnosis screen and used for diagnosis of the swing emergency stop valve 68.

<Diagnosis Screen of Terminal Device (Personal Computer)>

FIG. 11 is a diagram showing a diagnosis screen displayed on the screen 16b of the terminal device 16 (personal computer) connected to the terminal device connection unit 14e of the controller 14.

A selection menu for "ON (effective in right swing)" and "OFF (effective in right swing)" of the "swing right pressure reducing solenoid valve", a selection menu for "ON (ineffective in left swing)" and "OFF (effective in left swing)" of the "swing left pressure reducing solenoid valve", a selection menu for "ON (right low-pressure setting)" and "OFF (right normal setting)" of the "swing right low-pressure relief solenoid valve", a selection menu for "ON (left low-pressure setting)" and "OFF (left normal setting)" of the "swing left low-pressure relief solenoid valve", a monitor region for "swing right pilot pressure", a monitor region for "swing left pilot pressure", a monitor region for "swing right main pressure", a monitor region for "swing left main pressure", a monitor region for "swing right main pressure maximum value", and a monitor region for "swing left main pressure maximum value" are displayed on the screen 16b of the terminal device (personal computer) 16.

The "swing right pressure reducing solenoid valve" is intended for diagnosis related to the swing right pilot pressure reducing solenoid valve 65b. When the "ON (ineffective in right swing)" is highlight-selected and the enter button is pressed, the swing right pressure reducing solenoid valve 65b is turned ON so that right swing pilot pressure being a detected value of the swing right pilot pressure sensor 66b in that state is displayed in the monitor region of the "swing right pilot pressure". When the "OFF (effective in right swing)" is highlight-selected and the enter button is pressed, the swing right pilot pressure reducing solenoid valve 65b is turned OFF so that right swing pilot pressure being a detected value of the swing right pilot pressure sensor 66b in that state is displayed in the monitor region of the "swing right pilot pressure".

The "swing left pressure reducing solenoid valve" is intended for diagnosis related to the swing left pilot pressure reducing solenoid valve 65a. When the "ON (ineffective in left swing)" is highlight-selected and an enter button is pressed, the swing left pilot pressure reducing solenoid valve 65a is turned ON so that left swing pilot pressure being a value detected by the swing left pilot pressure sensor 66a in that state is displayed in the monitor region of the "swing left pilot pressure". When the "OFF (effective in left swing)" is highlight-selected and the enter button is pressed, the swing left pilot pressure reducing solenoid valve 65a becomes OFF so that left swing pilot pressure being a value detected by the swing left pilot pressure sensor 66a in that state is displayed in the monitor region of the "swing left pilot pressure".

The "swing right low-pressure relief solenoid valve" is intended for diagnosis related to the swing right low-pressure relief solenoid valve 63b. When the "ON (right low-pressure setting)" is highlight-selected and the enter button is pressed, the swing right low-pressure relief solenoid valve 63b becomes ON so that the current value of right swing pressure (pressure of actuator line 52b) corresponding to a detected value of the swing right pressure sensor 64b in that state is displayed in the monitor region of the "swing right main pressure". The maximum value of right swing pressure (pressure of actuator line 52b) after the "ON (right low-pressure setting)" is highlight-selected and the enter button is pressed, is displayed in the monitor region of the "swing right main pressure maximum value".

The "swing left low-pressure relief solenoid valve" is intended for diagnosis related to the swing left low-pressure relief solenoid valve 63a. When the "ON (left low-pressure setting)" is highlight-selected and the enter button is pressed, the swing left low-pressure relief solenoid valve 63a becomes ON so that the current value of left swing pressure (pressure of actuator line 52a) being a detected value of the swing left pressure sensor 64a in that state is displayed in the monitor region of the "swing left main pressure". The maximum value of left swing pressure (pressure of actuator line 52a) after the "ON (left low-pressure setting)" is highlight-selected and the enter button is pressed, is displayed in the monitor region of the "swing left main pressure maximum value".

Thus, a failure diagnosis for the system of the swing right pilot pressure reducing solenoid valve 65b, a failure diagnosis for the system of the swing left pilot pressure reducing solenoid valve 65a, a failure diagnosis for the system of the swing right low-pressure relief solenoid valve 63b, and a failure diagnosis for the system of the swing left low-pressure relief solenoid valve 63a can be carried out on one screen displayed in the screen 16b of the terminal device (personal computer) 16.

<<Semiautomatic Measurement Mode>>

A description will next be made of "semiautomatic measurement mode".

<Failure Diagnosis Function of "Swing Right Pressure Reducing Solenoid Valve>

Figure 17A:
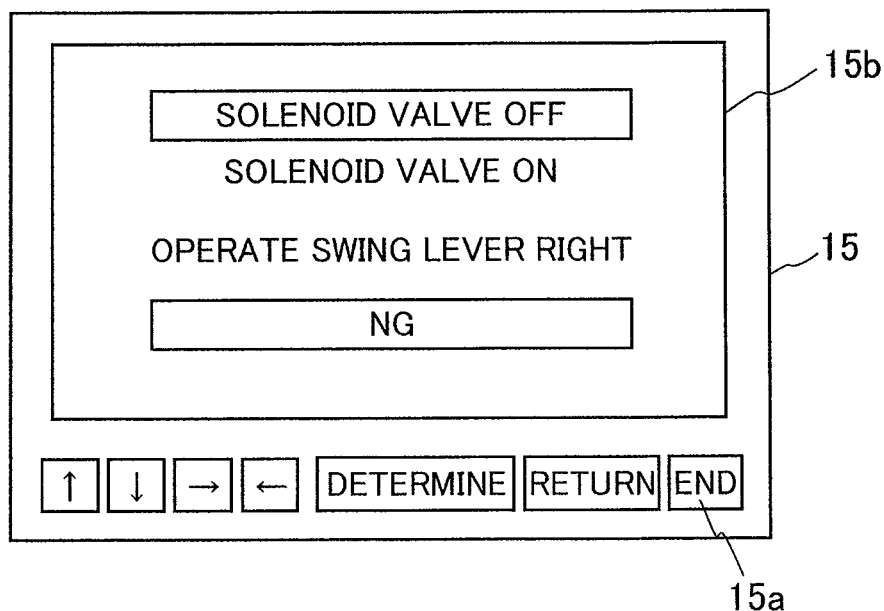
FIG. 17A is a failure diagnosis screen transitioned when in a "semiautomatic mode", the operator highlight-selects "the swing right pressure reducing solenoid valve" and presses the determination button as shown in FIG. 5, and is a diagram corresponding to FIG. 6A of a "manual measurement mode"
Figure 17B:
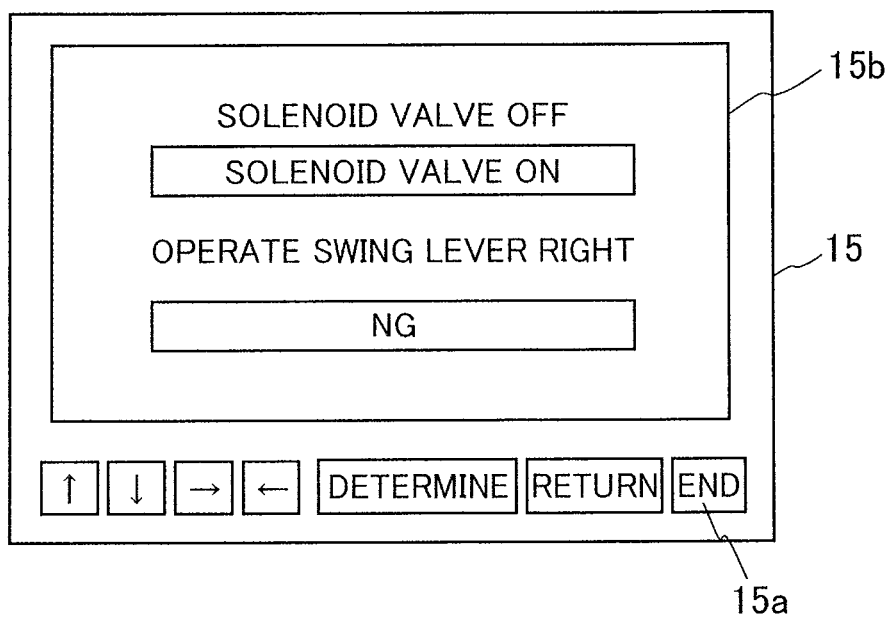
FIG. 17B is a failure diagnosis screen where the solenoid valve ON is highlight-selected in FIG. 17A and is a diagram corresponding to FIG. 6B of the "manual measurement mode"
Figure 20:
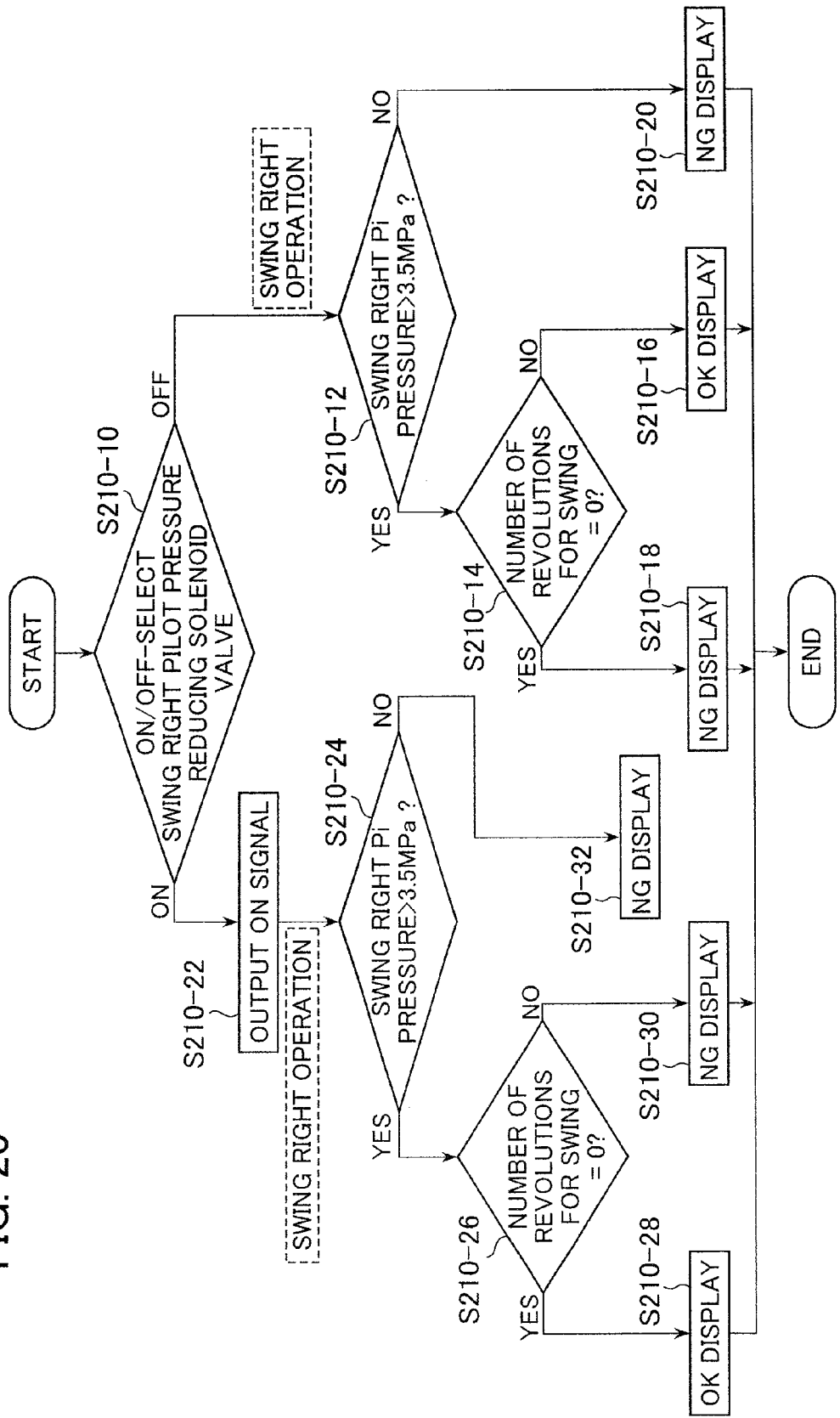
FIG. 20 is a failure diagnosis function started up at Step S200-2 of FIG. 13 when in the "semiautomatic mode", the "swing right pressure reducing solenoid valve" is highlight-selected and the determination button is pressed, and is a diagram corresponding to FIG. 14 of the "manual measurement mode"

FIG. 17A is a diagnosis screen transitioned when in a "semiautomatic mode", the operator highlight-selects "the swing right pressure reducing solenoid valve" and presses the determination button as shown in FIG. 5, and is a diagram corresponding to FIG. 6A of the "manual measurement mode". FIG. 17B is a diagnosis screen where the solenoid valve ON is highlight-selected in FIG. 17A and is a diagram corresponding to FIG. 6B of the "manual measurement mode". FIG. 20 is a flowchart showing a diagnosis function started up at Step S200-2 of FIG. 13 when in the "semiautomatic mode", the "swing right pressure reducing solenoid valve" is highlight-selected and the determination button is pressed, and is a diagram corresponding to FIG. 20 of the "manual measurement mode".

A selection menu for the "solenoid valve OFF" and "solenoid valve ON", a guidance for "operate swing lever right", and a determination region indicative of whether the result of diagnosis is OK (normal) or NG (abnormal) are displayed on the diagnosis screen of FIG. 17A.

<Selection of "Solenoid Valve Off">

First, when the operator highlight-selects the "solenoid valve OFF" and presses the determination button as shown in FIG. 17A, the controller 14 outputs an OFF signal to the swing right pilot pressure reducing solenoid valve 65b (it does not output the same thereto). The controller 14 inputs therein the swing pilot pressure detected by the swing right pilot pressure sensor 66b and the number of revolutions of the swing structure 20 detected by the revolution sensor 74 at that time and enables a state in which it is possible to determine whether the right pilot valve and the swing right pilot pressure sensor 66b are normal or abnormal (Step S210-10 of FIG. 20→S210-20).

Next, the operator fully operates the control lever of the control lever device 55 in the illustrated right direction of FIG. 2 in accordance with the guidance of FIG. 17A. At this time, the drive signal is not output to the swing right pilot pressure reducing solenoid valve 65b and the swing right pilot pressure reducing solenoid valve 65b is held in the open position without its operation. Therefore, if the right pilot valve provided in the control lever device 55 is normal, then a control pilot pressure near 4.0 MPa corresponding to prescribed pressure is outputted. The right control pilot pressure is given to the illustrated right pilot pressure input unit 12b of the swing directional control valve 12 as it is without its pressure reduction so that the swing directional control valve 12 is switched in the left direction. The right control pilot pressure generated at the right pilot valve of the control lever device 55 is selected by the shuttle valve 56 and given to the brake release cylinder 54b of the swing parking brake 54, so that the braking of the swing parking brake 54 is released to bring the swing structure 20 into a swingable state. As a result, hydraulic fluid from the hydraulic pump 51 is supplied to the swing hydraulic motor 52 via the left actuator line 52a, whereby the swing hydraulic motor 52 is rotatably driven to swing the swing structure 20.

The right control pilot pressure generated at the control lever device 55 is detected by the swing right pilot pressure sensor 66b, and the number of revolutions of the swing structure 20 is detected by the revolution sensor 74.

The controller 14 determines whether the detected control pilot pressure is a value near 4.0 MPa indicative of the prescribed pressure, e.g., a value higher than 3.5 MPa (Step 210-12 of FIG. 20). If the result of determination is found to be Yes, then the controller 14 further determines whether the number of revolutions of the swing structure 20 is zero (i.e., the swing structure 20 is not swung) (Step S210-14). If the result of determination is found to be No, then an OK display is shown in the determination region of the diagnosis screen of FIG. 17A (Step 210-16 of FIG. 20). Except for it, an NG display is made (Steps S210-18 and S210-20 in FIG. 20).

When the OK display is shown in the determination region of the diagnosis screen of FIG. 17A, the operator determines that the right pilot valve of the control lever device 55 and the swing right pilot pressure sensor 66b are both normal. When the NG display is made in the determination region of the diagnosis screen of FIG. 17A, the operator determines that a malfunction exists in either of the right pilot valve of the control lever device 55 and the swing right pilot pressure sensor 66b.

<Selection of "Solenoid Valve On">

Next, the operator highlight-selects the "solenoid valve ON" and presses the determination button as shown in FIG. 17B, the controller 14 outputs an ON signal (drive signal) to the swing right pilot pressure reducing solenoid valve 65b (Step S210-22 of FIG. 20). The controller 14 inputs therein the swing pilot pressure detected by the swing right pilot pressure sensor 66b and the number of revolutions of the swing structure 20 detected by the revolution sensor 74 at that time and enables a state in which it is possible to determine whether the right pilot valve and the swing right pilot pressure sensor 66b are normal or abnormal (Step S210-24→S210-32 in FIG. 20).

Next, the operator fully operates the control lever of the control lever device 55 in the illustrated right direction of FIG. 2 in accordance with the guidance of FIG. 17B. Since the drive signal is outputted to the swing right pilot pressure reducing solenoid valve 65b, the swing right pilot pressure reducing solenoid valve 65b is operated to take a fully closed state if the swing right pilot pressure reducing solenoid valve 65b is normal, thereby shutting off the right control pilot pressure generated at the control lever device 55, whereby the swing directional control valve 12 is held in the neutral position. As a result, the hydraulic fluid is not supplied from the hydraulic pump 51 to the swing hydraulic motor 52 and hence the swing hydraulic motor 52 is not rotatably driven to prevent the swing structure 20 from being swung.

The right control pilot pressure generated at the control lever device 55 is detected by the swing right pilot pressure sensor 66b, and the number of revolutions of the swing structure 20 is detected by the revolution sensor 74.

The controller 14 determines whether the detected control pilot pressure is a value near 4.0 MPa indicative of the prescribed pressure, e.g., a value higher than 3.5 MPa (Step 210-24 of FIG. 20). If the result of determination is found to be Yes, then the controller 14 further determines whether the number of revolutions of the swing structure 20 is zero (i.e., the swing structure 20 is not swung) (Step S210-26 of FIG. 20). If the result of determination is found to be Yes, then an OK display is shown in the determination region of the diagnosis screen of FIG. 17B (Step 210-28 of FIG. 20). Except for it, an NG display is made (Steps S210-30 and S210-32 in FIG. 20).

Preferably, the operator performs the failure diagnosis of "solenoid valve ON" described herein after it is confirmed that the right pilot valve and the swing right pilot pressure sensor 66b are normal at the above-described failure diagnosis of "solenoid valve OFF". When the determination region of the diagnosis screen of FIG. 17B indicates the OK display, the swing right pilot pressure reducing solenoid valve 65b is determined to be normal. When the determination region of the diagnosis screen of FIG. 17B indicates the NG display, the swing right pilot pressure reducing solenoid valve 65b is determined to have a malfunction.

<Failure Diagnosis Function of "Swing Left Pressure Reducing Solenoid Valve">

The failure diagnosis function of "swing left pressure reducing solenoid valve" in the "semiautomatic mode" is substantially identical to the above-described failure diagnosis function of "swing right pressure reducing solenoid valve" except that the "right" changes to the "left" in FIGS. 17A and 17B and FIG. 20. At the diagnosis screen, the "solenoid valve OFF" is selected, the determination button is pressed and the control lever of the control lever device 55 is fully operated in the left direction illustrated in FIG. 2. It is thus possible to determine the normality or abnormality of the left pilot valve and the swing left pilot pressure sensor 66a. After it is confirmed that the swing left pilot valve and the swing left pilot pressure sensor 66a are normal, the "solenoid valve ON" is selected and the determination button is pressed, and the control lever of the control lever device 55 is fully operated in the left direction illustrated in FIG. 2. It is thus possible to determine the normality or abnormality of the swing left pilot pressure reducing solenoid valve 65a.

<Failure Diagnosis Function of "Swing Right Low-Pressure Relief Solenoid Valve">

Figure 18:
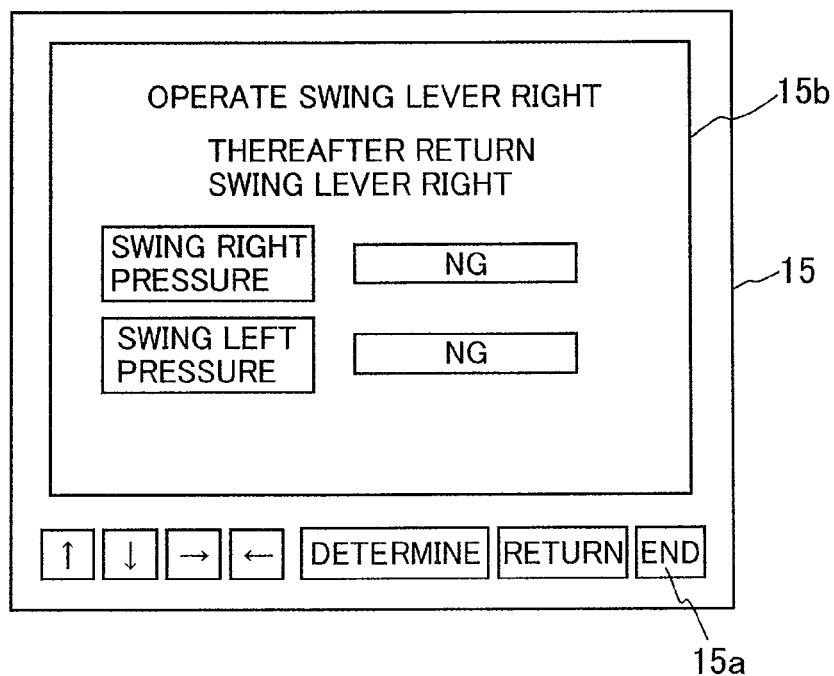
FIG. 18 is a failure diagnosis screen transitioned at Step S300-2 of FIG. 13 when in the "semiautomatic mode", the operator highlight-selects "the swing right low-pressure relief solenoid valve" and presses the determination button as shown in FIG. 7, and is a diagram corresponding to FIG. 8 of "the manual measurement mode"
Figure 21:
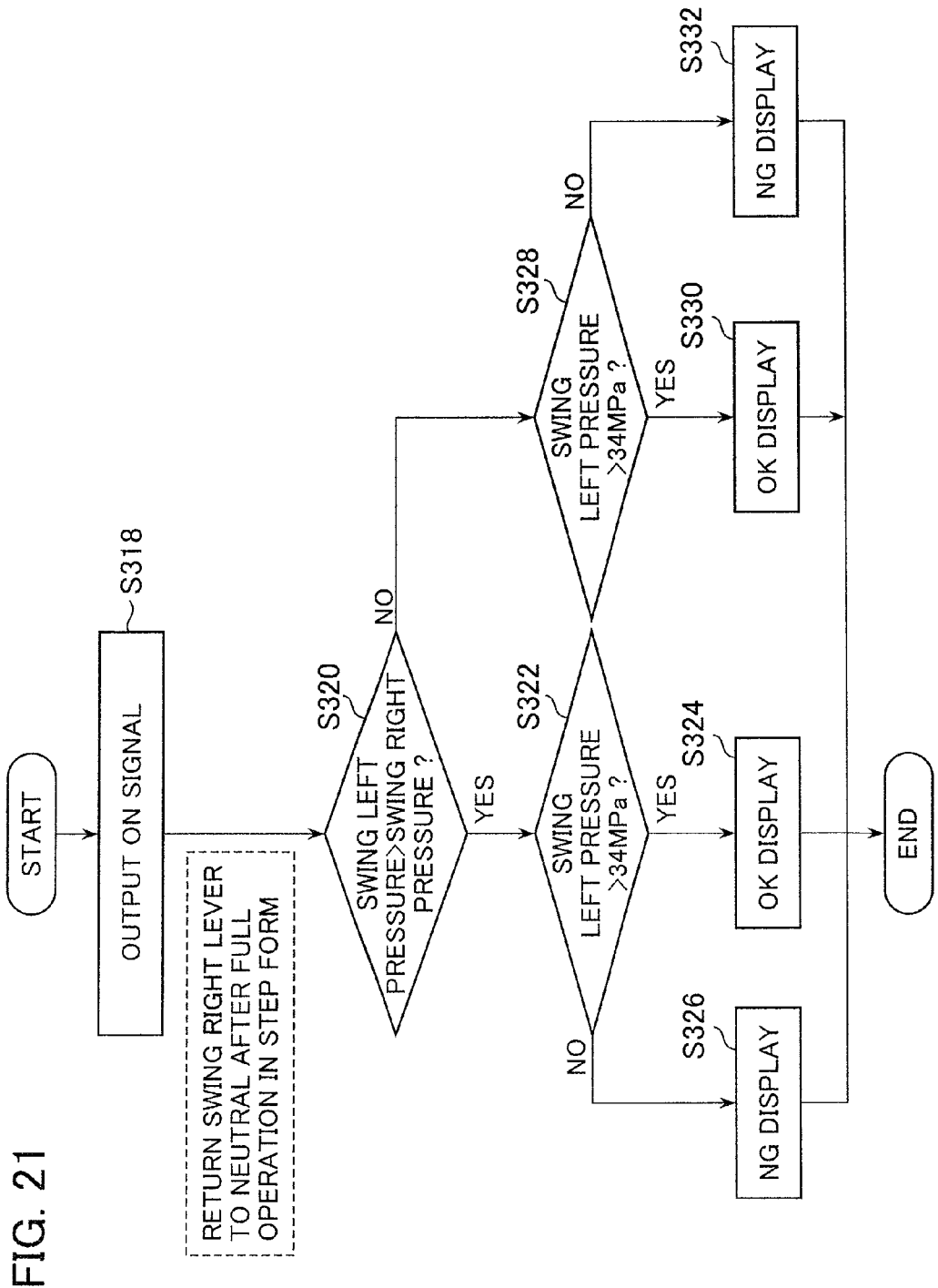
FIG. 21 is a flowchart showing a failure diagnosis function started up at Step S300-2 of FIG. 13 when in the "semiautomatic mode", the "swing right low-pressure relief solenoid valve" is highlight-selected and the determination button is pressed, and is a diagram corresponding to FIG. 15 of the "manual measurement mode"

FIG. 18 is a diagnosis screen transitioned at Step S300-2 of FIG. 13 when in the "semiautomatic mode", the operator highlight-selects "the swing right low-pressure relief solenoid valve" and presses the determination button as shown in FIG. 7, and is a diagram corresponding to FIG. 8 of "the manual measurement mode". FIG. 21 is a flowchart showing a failure diagnosis function started up at Step S300-2 of FIG. 13 when in the "semiautomatic mode", the "swing right low-pressure relief solenoid valve" is highlight-selected and the determination button is pressed, and is a diagram corresponding to FIG. 15 of the "manual measurement mode".

A guidance for "operate swing lever right and thereafter return swing lever right", and a determination region for "swing left pressure" and "swing right pressure" indicative of whether the results of diagnosis of the pressures of the left actuator line 52a and the right actuator line 52b, which have been detected by the swing right-and-left pressure sensors 64a and 64b, are OK (normal) or NG (abnormal), are displayed on the diagnosis screen of FIG. 18.

When the operator highlight-selects the "swing right low-pressure relief solenoid valve" and presses the determination button as shown in FIG. 7, the window screen in the screen 15b is transitioned to the diagnosis screen of FIG. 18 and at the same time the controller 14 outputs an ON signal (maximum drive signal) to the swing right low-pressure relief solenoid valve 63b (Step S318 of FIG. 21). At this time, the relief right low-pressure solenoid valve 63b is switched from the illustrated position to output control pressure, and the relief pressure changeover valve 62b is changed over to the open position so that the low pressure relief valve 61b is brought to an operable state. That is, the right actuator line 52b is brought to a low pressure relief pressure set state. On the other hand, since the relief pressure changeover valve 62a remains in the closed position, the high pressure relief valve 57a is still in an operable state and hence the left actuator line 52a is in a high pressure relief pressure set state.

Next, when the operator fully operates the control lever of the control lever device 55 in the illustrated right direction of FIG. 2 in step form in accordance with the guidance of FIG. 18, the swing directional control valve 12 is switched in the left direction so that the swing hydraulic motor 52 is rotatably driven to swing the swing structure 20. At the swing startup, the left actuator line 52a rises up to the set pressure of the high pressure relief valve 57a so that a driving force corresponding to the set pressure is generated at the swing hydraulic motor 52. Next, when the operator returns the control lever of the control lever device 55 in the neutral direction in step form in accordance with the guidance of FIG. 18, the pressure (back pressure of swing hydraulic motor 52) of the right actuator line 52b is raised to the set pressure of the low pressure relief valve 61b so that a braking force corresponding to the set pressure is generated at the swing hydraulic motor 52.

The pressures of the actuator lines 52a and 52b are respectively detected by the swing right-and-left pressure sensors 64a and 64b. The controller 14 inputs the detected pressures therein and determines whether the swing right low-pressure relief solenoid valve 63b, the relief pressure changeover valve 62b and the low pressure relief valve 61b are normal or abnormal (Steps S320 to S332 of FIG. 21).

That is, the controller 14 determines whether the pressure (swing left pressure) detected by the swing left pressure sensor 64a is higher than the pressure (swing right pressure) detected by the swing right pressure sensor 64b (Step S320 of FIG. 21). If the result of determination is found to be Yes, then it shows the time of a swing startup at which the control lever of the control lever device 55 is fully operated in step form in the illustrated right direction of FIG. 2. Therefore, the controller 14 determines whether the swing left pressure detected by the swing left pressure sensor 64a is a value near the set pressure (e.g., 36 MPa) of the high pressure relief valve 57a, e.g., a value higher than 34 MPa (Step S322 of FIG. 21). If the result of determination is found to be Yes, then an OK display is shown in the determination region of "swing left pressure" in the diagnosis screen of FIG. 18 (Step S324 of FIG. 21). If the answer of determination is found to be No, then an NG display is done (Step S326 of FIG. 21).

When the result of determination at Step S322 is found to be No, it shows swing braking at which the control lever of the control lever device 55 is stepwise returned in the neutral direction. Therefore, the controller 14 determines whether the swing right pressure detected by the swing right pressure sensor 64b is a value near the set pressure (e.g., 28 MPa) of the low pressure relief valve 61b, e.g., a value higher than 26 MPa (Step S328 of FIG. 21). If the result of determination is found to be Yes, then an OK display is shown in the determination region of "swing right pressure" in the diagnosis screen of FIG. 18 (Step S330 of FIG. 21). If the result of determination is found to be No, then an NG display is made (Step S332 of FIG. 21).

If the determination region of "swing right pressure" in the diagnosis screen of FIG. 18 indicates the OK display, then the operator determines that the swing right low-pressure relief solenoid valve 63b, the relief pressure changeover valve 62b and the low pressure relief valve 61b are all normal. In the case of the NG display, it is determined that a malfunction exists in any of the swing right low-pressure relief solenoid valve 63b, the relief pressure changeover valve 62b and the low pressure relief valve 61b.

<Failure Diagnosis Function of "Swing Left Low-Pressure Relief Solenoid Valve">

The failure diagnosis function of "swing left low-pressure relief solenoid valve" is substantially identical to the above-described failure diagnosis function of "swing right low-pressure relief solenoid valve" except that the "right" changes to the "left" and the "left" changes to the "right". The control lever of the control lever device 55 is fully operated in step form in the illustrated left direction of FIG. 2 to pivotally start up. Thereafter, the control lever of the control lever device 55 is returned in the neutral direction in step form to brake in turn, whereby it is possible to determine whether the swing left low-pressure relief solenoid valve 63a, the relief pressure changeover valve 62a and the low pressure relief valve 61a are normal or abnormal.

<Failure Diagnosis Function of "Swing Emergency Stop">

Figure 19:
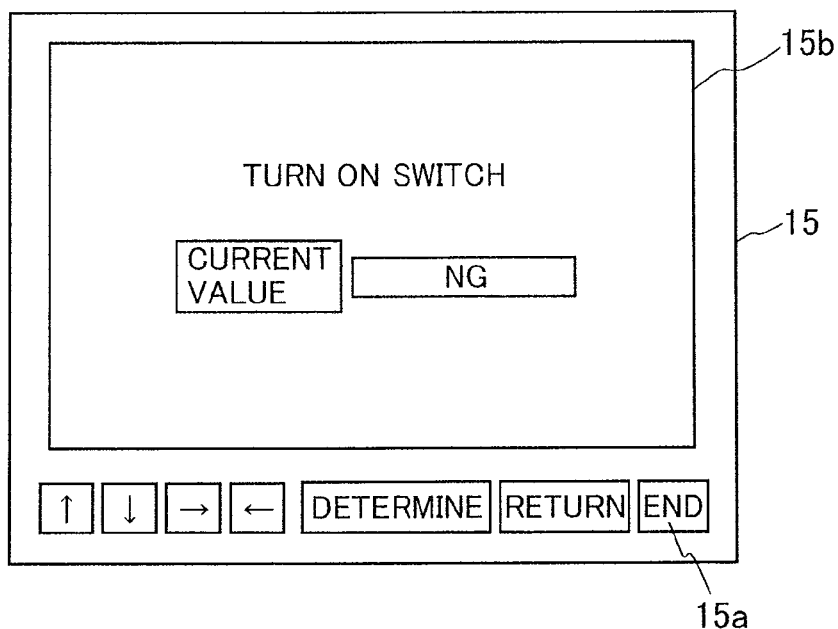
FIG. 19 is a failure diagnosis screen transitioned at Step S400-2 of FIG. 13 when in the "semiautomatic mode", the operator highlight-selects the "swing emergency stop" and presses the determination button as shown in FIG. 9, and is a diagram corresponding to FIG. 10 of the "manual measurement mode"
Figure 22:
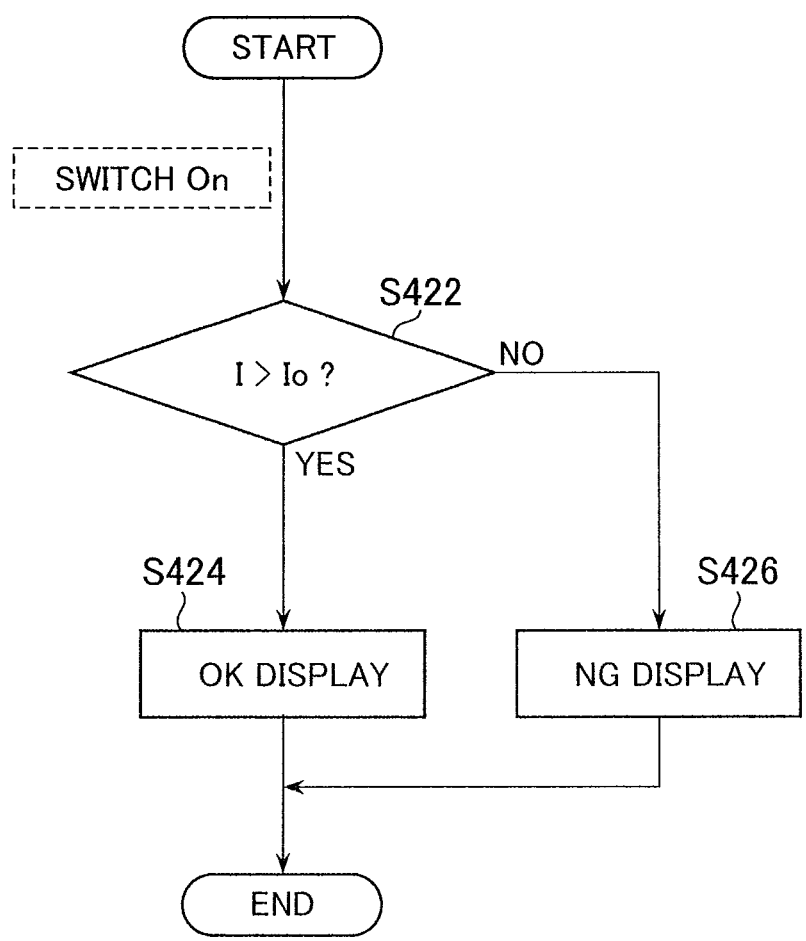
FIG. 22 is a flowchart showing a failure diagnosis function started up at Step S400-2 of FIG. 13 when in the "semiautomatic mode", the "swing emergency stop" is highlight-selected and the determination is pressed, and is a diagram corresponding to FIG. 16 of the "manual measurement mode".

FIG. 19 is a diagnosis screen transitioned at Step S400-2 of FIG. 13 when in the "semiautomatic mode", the operator highlight-selects the "swing emergency stop" and presses the determination button as shown in FIG. 9, and is a diagram corresponding to FIG. 10 of the "manual measurement mode". FIG. 22 is a flowchart showing a failure diagnosis function started up at Step S400-2 of FIG. 13 when in the "semiautomatic mode", the "swing emergency stop" is highlight-selected and the determination is pressed, and is a diagram corresponding to FIG. 16 of the "manual measurement mode".

A guidance for "turn ON switch", and a determination region for "current value" indicative of whether the result of diagnosis of current flowing through the power supply line of the emergency stop valve 68, which is detected by the current sensor 73, is OK (normal) or NG (abnormal), are displayed on the diagnosis screen of FIG. 19.

When the operator turns ON the switch 71 in accordance with the guidance of FIG. 19, the current flows through the power supply line of the emergency stop valve 68. The current is detected by the current sensor 73, and the controller 14 inputs the detected current therein and determines the normality or abnormality of the swing emergency stop valve 68 (Step S422→S426 in FIG. 22).

That is, if the current I flowing through the power supply line of the emergency stop valve 68 is larger than a prescribed value $I_0$, the controller 14 produces an OK display in the determination region of "current value". If the current I is not greater than the prescribed value $I_0$, then controller 14 produces an NG display in the determination region of "current value".

If the determination region of "current value" indicates the OK display, then the operator determines that the swing emergency stop valve 68 is normal. If the NG display is shown, then the operator determines that a malfunction exists in the swing emergency stop valve 68.

Incidentally, as the need arises, the detected value of the swing brake pressure sensor 67 at the time that the control lever device 55 is manipulated, can be input to the controller 14 and used in diagnosis of the swing emergency stop valve 68.

Advantageous Effects

According to the present embodiment configured as described above, the solenoid valves 63a, 63b, 65a and 65b are driven in the failure diagnosis mode separately from the normal control to thereby make it possible to easily perform failure diagnosis for the solenoid valves 63a, 63b, 65a and 65b and sensors 64a, 64b, 66a and 66b with satisfactory accuracy. Since the failures of the solenoid valves 63a, 63b, 65a and 65b and sensors 64a, 64b, 66a and 66b can be determined in conjunction with one another, the failure diagnosis good in efficiency is enabled. The failure diagnosis of the swing emergency stop valve 68 can also be performed by turning ON the switch 71.

<Other Variations>

Although the above-described embodiment has shown the case where the present invention is applied to the hybrid type hydraulic excavator that drives the swing structure using the hydraulic motor and the electric motor, the application of the present invention thereto is not limited to such a hydraulic excavator. In, for example, a hydraulic excavator that makes it possible to change a shovel mechanism from a shovel mechanism having a normal length to a shovel mechanism called a super long, which is longer in length than the shovel mechanism having the normal length, a swing moment increases by an increase in the length of the shovel mechanism where the shovel mechanism is changed into the shovel mechanism called the super long. It is therefore necessary to switch swing relief pressure to pressure higher than the normal set pressure. When the open area of a directional control valve is designed to match with the shovel mechanism configured as the super long, the open area of the directional control valve with respect to an operation amount (swing pilot pressure) of a control lever is excessively narrow where the shovel mechanism having the normal length is mounted. It is therefore necessary to appropriately reduce the swing pilot pressure and adjust the open area relative to the lever operation amount in an open direction. In order to perform the switching of the swing relief pressure and the reduction in the swing pilot pressure as described above, there are needs to provide a hydraulic system with high pressure relief valves 57a and 57b, low pressure relief valves 61a and 61b and relief pressure changeover valves 62a and 62b in a manner similar to the hybrid type hydraulic excavator according to the above embodiment and to provide a control system with low-pressure relief solenoid valves 63a and 63b, swing right-and-left pressure sensors 64a and 64b, swing right-and-left pilot pressure reducing solenoid valves 65a and 65b and swing right-and-left pilot pressure sensors 66a and 66b. The present invention can also be applied to such a hydraulic excavator.

If the present invention includes a hydraulic system that drives a construction machine and a control system that controls the hydraulic system, and the control system is provided with a plurality of sensors, a plurality of solenoid valves and a controller, then the present invention can be applied even to a construction machine (e.g., a hydraulic crane, a wheel shovel, etc.).

Further, in the above embodiment, the maximum drive signal has been outputted from the controller to the solenoid valve as a failure diagnosis drive signal. A drive signal of a predetermined level (e.g., middle level) other than the maximum drive signal is however outputted to display a pressure value, and further detailed diagnosis may be carried out.

The failure diagnosis based on the information management system of the present invention is performed upon shipment inspection of a construction machine or post-shipment maintenance, but can be performed with desired timing even on the end user side. No particular limitation is however imposed on the timing of execution of failure diagnosis or its executor.

What is claimed is:

1. An information management system for a hydraulic excavator, comprising:
   a track structure;
   a swing structure provided over the track structure;
   a hydraulic system including a swing hydraulic motor which pivotally drives the swing structure, a directional control valve which controls the direction of hydraulic fluid supplied to the swing hydraulic motor and a flow rate thereof, and a swing lever device which generates swing pilot pressure for giving instructions for a swing operation of the swing structure and outputs the swing pilot pressure to a corresponding pilot pressure input unit of the direction control valve; and
   a control system which controls the hydraulic system,
   wherein the control system includes a plurality of sensors which respectively output various status signals of the hydraulic system, a plurality of solenoid valves which respectively output various operation control pressures for controlling the hydraulic system, and a controller which inputs the status signals therein and outputs drive signals for driving the solenoid valves,
   wherein said information management system further comprises a monitor device which transfers information to and from the controller and displays various items of information thereon, the monitor device having an input device that receives an input,
   wherein the controller has a failure diagnosis mode selectable by the input device of the monitor device,
   wherein said plurality of solenoid valves includes a swing pilot pressure reducing solenoid valve which is disposed between the swing lever device and the pilot pressure input unit of the directional control valve and reduces the swing pilot pressure outputted from the swing lever device, and said plurality of sensors includes a first pressure sensor which detects the swing pilot pressure outputted from the swing lever device and outputs the swing pilot pressure as an electric signal, and
   wherein when the failure diagnosis mode is selected by the input device and instructions for failure diagnosis related to the swing pilot pressure reducing solenoid valve are given, the controller selectively outputs, as a failure diagnosis drive signal, a signal for maintaining the swing pilot pressure without any reduction, and a signal for shutting off the swing pilot pressure, to the swing pilot pressure reducing solenoid valve and displays a guidance for failure diagnosis on the monitor device, and the controller inputs an output value from the first pressure sensor when the swing lever device is operated in accordance with the guidance and displays, based on the output value from the first pressure sensor, information as to whether the swing pilot pressure reducing solenoid valve and the first pressure sensor are normal, on the monitor device.

2. The information management system according to claim 1, wherein the controller has a storage unit which stores a normal value of the first pressure sensor, and wherein in the failure diagnosis mode, the controller compares the output value given from the first pressure sensor, when the controller outputs the failure diagnosis drive signal, with the normal value stored in the storage unit to thereby determine whether the swing pilot pressure reducing solenoid valve and the first pressure sensor are normal, and displays a result of determination on the monitor device.

3. An information management system for a hydraulic excavator comprising:
a track structure;
a swing structure provided over the track structure;
a hydraulic system including a swing hydraulic motor which pivotally drives the swing structure, a directional control valve which controls the direction of hydraulic fluid supplied to the swing hydraulic motor and a flow rate thereof, and a swing lever device which generates swing pilot pressure for giving instructions for a swing operation of the swing structure and outputs the swing pilot pressure to a corresponding pilot pressure input unit of the directional control valve; and
a control system which controls the hydraulic system,
wherein the control system includes a plurality of sensors which respectively output various status signals of the hydraulic system, a plurality of solenoid valves which respectively output various operation control pressures for controlling the hydraulic system, and a controller which inputs the status signals therein and outputs drive signals for driving the solenoid valves,
wherein said information management system further comprises a monitor device which transfers information to and from the controller and displays various items of information thereon, the monitor device having an input device that receives an input,
wherein the controller has a failure diagnosis mode selectable by the input device of the monitor device,
wherein said plurality of solenoid valves includes a relief set pressure change solenoid valve which changes a maximum drive pressure of the swing hydraulic motor, and said plurality of sensors includes a first pressure sensor which detects pressure at an input/output port of the swing hydraulic motor and outputs the pressure at an input/output port as an electric signal,
wherein when the failure diagnosis mode is selected by the input device and instructions for failure diagnosis related to the relief set pressure change solenoid valve are given, the controller outputs, as a failure diagnosis drive signal, a signal for changing the maximum drive pressure of the swing hydraulic motor to the relief set pressure change solenoid valve and displays a guidance for failure diagnosis on the monitor device, and the controller inputs an output value from the first pressure sensor therein when the swing lever device is operated in accordance with the guidance and displays, based on the output value given from the first pressure sensor, information as to whether the relief set pressure change solenoid valve and the first pressure sensor are normal, on the monitor device.

4. The information management system according to claim 3, wherein the controller has a storage unit which stores a normal value of the first pressure sensor therein, and
wherein in the failure diagnosis mode, the controller compares the output value given from the first pressure sensor, when the controller outputs the failure diagnosis drive signal, with the normal value stored in the storage unit to thereby determine whether the relief set pressure change solenoid valve and the first pressure sensor are normal, and displays a result of determination on the monitor device.

5. An information management system for a hydraulic excavator comprising:
a track structure,
a swing structure provided over the track structure;
a hydraulic system including a swing hydraulic motor which pivotally drives the swing structure, a directional control valve which controls the direction of hydraulic fluid supplied to the swing hydraulic motor and a flow rate thereof, and a swing lever device which generates swing pilot pressure for giving instructions for a swing operation of the swing structure and outputs the swing pilot pressure to a corresponding pilot pressure input unit of the directional control valve,
a control system which controls the hydraulic system, and
an electric system having a swing electric motor which pivotally drives the swing structure in cooperation with the swing hydraulic motor,
wherein the control system includes a plurality of sensors which respectively output various status signals of the hydraulic system, a plurality of solenoid valves which respectively output various operation control pressures for controlling the hydraulic system, and a controller which inputs the status signals therein and outputs drive signals for driving the solenoid valves,
wherein said information management system comprises a monitor device which transfers information to and from the controller and displays various items of information thereon, the monitor device having an input device that receives input,
wherein the controller has a failure diagnosis mode selectable by the input device of the monitor device,
wherein the controller is configured to switch between a hydraulic electric combined swing mode in which both the swing hydraulic motor and the swing electric motor pivotally drives the swing structure in cooperation with each other, and a hydraulic single swing mode in which the swing electric motor is stopped and the swing structure is driven only by the swing hydraulic motor,
wherein said plurality of solenoid valves include a swing pilot pressure reducing solenoid valve which is disposed between the swing lever device and the pilot pressure input unit of the directional control valve and reduces the swing pilot pressure outputted from the swing lever device and a relief set pressure change solenoid valve which changes a maximum drive pressure of the swing hydraulic motor,
wherein said plurality of sensors include a first pressure sensor which detects the swing pilot pressure outputted from the swing lever device and outputs the swing pilot pressure as an electric signal, and a second pressure sensor which detects pressure at an input/output port of the swing hydraulic motor and outputs the pressure at the input/output port as an electric signal,
wherein the controller outputs a control drive signal to the relief set pressure change solenoid valve when the hydraulic electric combined swing mode is selected, and the controller outputs a control drive signal to the swing pilot pressure reducing solenoid valve when the hydraulic single swing mode is selected,
wherein the controller is programmed to execute:
a first failure diagnosis process in which when the failure diagnosis mode is selected by the input device and instructions for failure diagnosis related to the swing pilot pressure reducing solenoid valve are given, the controller selectively outputs, as a failure diagnosis drive signal, a signal for maintaining the swing pilot pressure without any reduction and a signal for shutting off the swing pilot pressure, to the swing pilot pressure reducing solenoid valve and displays a guidance for failure diagnosis on the monitor device, and the controller inputs an output value from the first pressure sensor therein when the swing lever device is operated in accordance with the guidance and displays, based on the output value from the first pressure sensor, information as to whether the swing pilot pressure reducing solenoid valve and the first pressure sensor are normal, on the monitor device; and a second failure diagnosis process in which when the failure diagnosis mode is selected by the input device and instructions for failure diagnosis related to the relief set pressure change solenoid valve are given, the controller outputs, as a failure diagnosis drive signal, a signal for changing the maximum drive pressure of the swing hydraulic motor to the relief set pressure change solenoid valve and displays a guidance for failure diagnosis on the monitor device, and the controller inputs an output value from the second pressure sensor therein when the swing lever device is operated in accordance with the guidance and displays, based on the output value given from the second pressure sensor, information as to whether the relief set pressure change solenoid valve and the second pressure sensor are normal, on the monitor device.

6. The information management system according to claim 5, wherein the controller has a storage unit which stores a normal value of the first pressure sensor therein, and wherein in the failure diagnosis mode, the controller compares the output value given from the first pressure sensor when the controller outputs the failure diagnosis drive signal, with the normal value stored in the storage unit to thereby determine whether the swing pilot pressure reducing valve solenoid valve and the first pressure sensor are normal, and displays a result of determination on the monitor device.

* * * * *